US007006018B2

(12) United States Patent
Noda et al.

(10) Patent No.: US 7,006,018 B2
(45) Date of Patent: *Feb. 28, 2006

(54) ENCODING APPARATUS AND METHOD, RECORDING MEDIUM AND PROGRAM

(75) Inventors: Makoto Noda, Tokyo (JP); Hiroyuki Yamagishi, Tokyo (JP)

(73) Assignee: Sony Corporation, Tokyo (JP)

( * ) Notice: Subject to any disclaimer, the term of this patent is extended or adjusted under 35 U.S.C. 154(b) by 33 days.

This patent is subject to a terminal disclaimer.

(21) Appl. No.: 11/094,919

(22) Filed: Mar. 31, 2005

(65) Prior Publication Data

US 2005/0168357 A1    Aug. 4, 2005

Related U.S. Application Data

(63) Continuation of application No. 10/799,893, filed on Mar. 10, 2004, now Pat. No. 6,891,483.

(30) Foreign Application Priority Data

Mar. 24, 2003   (JP)   ............................. P2003-079556

(51) Int. Cl.
    *H03M 5/00*   (2006.01)
(52) U.S. Cl. ...................................... 341/58
(58) Field of Classification Search ................ 341/101, 341/106, 59, 100, 58; 714/761, 800, 799, 714/754, 812, 802
    See application file for complete search history.

(56) References Cited

U.S. PATENT DOCUMENTS 5,703,580 A * 12/1997 Ko .............................. 341/59

* cited by examiner

*Primary Examiner*—Brian Young
(74) *Attorney, Agent, or Firm*—Jay H. Maioli

(57) ABSTRACT

A code sequence is encoded using a code conversion table in which the parity of the code sequence varies until the code states become equal to each other. The code word assignment used in this code conversion table is such that the decoded code word constraint length is 3 blocks and $q_0 \neq q_1$ for an arbitrary information sequence is satisfied even if a DC control bit is inserted at any of the first and second bits of an information word. For example, code states $s_0$ and $s_1$ when information sequences $d_0$ and $d_1$ resulted from insertion of provisional DC control bits 1 and 0 inserted at the top of an information sequence "1, 1, 0, 0, 0, 1, 0" are encoded starting with a state 3 according to a predetermined code conversion table are equal to each other, namely, $s_0 = s_1 = 6$, in a third block, and two's complement $q_0$ of a sum of code sequences $c_0$ up to a time when the code states are equal to each other is "0" while two's complement $q_1$ of a sum of code sequences $c_1$ up to that time is "1". That is, the condition that $q_0 \neq q_1$ is met. The present invention can be applied to a recorder/player or encoder.

1 Claim, 28 Drawing Sheets

| Data | Code |
|---|---|
| 00 | 101 |
| 01 | 100 |
| 10 | 001 |
| 11 | 010 |

FIG.2

| Data | Code |
|---|---|
| 00.00 | 101.000 |
| 00.01 | 100.000 |
| 10.00 | 001.000 |
| 10.01 | 010.000 |

FIG.3

|   | 00    | 01    | 10    | 11    |
|---|-------|-------|-------|-------|
| 1 | 101/5 | 100/5 | 101/3 | 101/4 |
| 2 | 100/1 | 100/2 | 100/3 | 100/4 |
| 3 | 001/5 | 010/5 | 001/3 | 001/4 |
| 4 | 010/1 | 010/2 | 010/3 | 010/4 |
| 5 | 000/1 | 000/2 | 000/3 | 000/4 |

FIG.4

|   | 00 | 01 | 10 | 11 |
|---|---|---|---|---|
| 1 | 010/1 | 010/2 | 010/3 | 100/3 |
| 2 | 100/1 | 100/2 | 101/3 | 101/4 |
| 3 | 000/1 | 000/2 | 001/3 | 001/4 |
| 4 | 010/1 | 010/2 | 010/3 | 000/3 |

FIG.6

| Data | Code |
|---|---|
| ("0") 11 | 101 |
| ("1") 11 | 000 |
| 10 | 001 |
| 01 | 010 |
| 00.11 | 010.100 |
| 00.10 | 010.000 |
| 00.01 | 000.100 |
| 00.00.11 | 000.100.100 |
| 00.00.10 | 000.100.000 |
| 00.00.01 | 010.100.100 |
| 00.00.00 | 010.100.000 |

[ ("0") MEANS THAT IMMEDIATELY PRECEDING BIT IS 0 ]

[ ("1") MEANS THAT IMMEDIATELY PRECEDING BIT IS 1 ]

FIG.7

| Data | Code |
|---|---|
| 00.00.10.00 | 000.100.100.100 |
| 00.00.00.00 | 010.100.100.100 |

FIG.8

| Data | Code |
|---|---|
| 11.01.11("010") | 001.000.000 |

[ ("010") MEANS THAT IMMEDIATELY FOLLOWING BIT IS 010 ]

FIG.9

| CODE CONVERSION TABLE | NO. OF STATES | CODE WORD CONSTRAINT LENGTH (IN BLOCKS) | ERROR PROPAGATION LENGTH (IN BITS) |
|---|---|---|---|
| FIGS. 2 AND 3 OR FIG. 4 | 5 | 3 | 5 |
| FIG. 6 | 4 | 3 | 5 |
| FIGS. 7 AND 8 | 104 | 5 | 10 |
| FIGS. 7, 8 AND 9 | 1691 | 6 | 11 |

FIG. 10

| INFORMATION SEQUENCE $d_0$ | 01 | 10 | 00 | 10 |
|---|---|---|---|---|
| CODE SEQUENCE $c_0$ | 100 | 101 | 000 | 010 |
| CODE STATE $s_0$ | 2 | 3 | 1 | 3 |
| INFORMATION SEQUENCE $d_1$ | 11 | 10 | 00 | 10 |
| CODE SEQUENCE $c_1$ | 101 | 010 | 000 | 010 |
| CODE STATE $s_1$ | 4 | 3 | 1 | 3 |

FIG.14

| 1 | 010/3 | 010/6 | 100/3 | 100/6 |
|---|---|---|---|---|
| 2 | 010/3 | 010/6 | 000/3 | 000/6 |
| 3 | 000/1 | 000/4 | 000/5 | 000/7 |
| 4 | 010/1 | 010/4 | 010/5 | 010/7 |
| 5 | 100/1 | 100/4 | 100/5 | 100/7 |
| 6 | 001/2 | 001/3 | 001/4 | 001/6 |
| 7 | 101/2 | 101/3 | 101/4 | 101/6 |

FIG.15

| L [IN BLOCKS] | N (L) | |
|---|---|---|
| | CONSTRAINT LENGTH 4 | CONSTRAINT LENGTH 3 |
| 1 | 955,514,880 | 63,700,992 |
| 2 | 761,384,832 | 68,950,144 |
| 3 | 15,381,808 | 1,845,872 |
| 4 | 447,800 | 83,240 |
| 5 | 328,272 | 65,648 |
| 6 | 327,680 | 65,536 |
| 7 | 327,680 | 65,536 |

FIG.18

| TYPE | CONSTRAINT LENGTH 4 | CONSTRAINT LENGTH 3 |
|---|---|---|
| 1 | 163,840 | 32,768 |
| 2 | 163,840 | 32,768 |
| 3 | 163,840 | 32,768 |

FIG.19

|   | 00 | 01 | 10 | 11 |
|---|---|---|---|---|
| 1 | 010/6 | 010/3 | 100/3 | 100/6 |
| 2 | 010/6 | 010/3 | 000/6 | 000/3 |
| 3 | 000/1 | 000/5 | 000/4 | 000/7 |
| 4 | 010/1 | 010/5 | 010/4 | 010/7 |
| 5 | 100/1 | 100/5 | 100/4 | 100/7 |
| 6 | 001/2 | 001/6 | 001/4 | 001/3 |
| 7 | 101/2 | 101/6 | 101/4 | 101/3 |

FIG.20

|   | 00 | 01 | 10 | 11 |
|---|---|---|---|---|
| 1 | 010/3 | 010/6 | 100/6 | 100/3 |
| 2 | 010/3 | 010/6 | 000/3 | 000/6 |
| 3 | 000/5 | 000/1 | 000/7 | 000/4 |
| 4 | 010/5 | 010/1 | 010/7 | 010/4 |
| 5 | 100/5 | 100/1 | 100/7 | 100/4 |
| 6 | 001/6 | 001/2 | 001/3 | 001/4 |
| 7 | 101/6 | 101/2 | 101/3 | 101/4 |

FIG.21

|   | 00 | 01 | 10 | 11 |
|---|---|---|---|---|
| 1 | 100/6 | 010/6 | 010/3 | 100/3 |
| 2 | 000/3 | 010/6 | 010/3 | 000/6 |
| 3 | 000/7 | 000/1 | 000/5 | 000/4 |
| 4 | 010/7 | 010/1 | 010/5 | 010/4 |
| 5 | 100/7 | 100/1 | 100/5 | 100/4 |
| 6 | 001/3 | 001/2 | 001/6 | 001/4 |
| 7 | 101/3 | 101/2 | 101/6 | 101/4 |

FIG.22

| INFORMATION SEQUENCE $d_0$ | 01 | 10 | 00 | 10 |
|---|---|---|---|---|
| CODE SEQUENCE $c_0$ | 000 | 100 | 001 | 001 |
| CODE STATE $s_0$ | 1 | 6 | 6 | 3 |
| INFORMATION SEQUENCE $d_1$ | 11 | 10 | 00 | 10 |
| CODE SEQUENCE $c_1$ | 000 | 010 | 101 | 001 |
| CODE STATE $s_1$ | 4 | 7 | 6 | 3 |

FIG.23

| Data | Code |
|---|---|
| 10 | 010 |
| ("0") 11 | 101 |
| ("1") 11 | 000 |
| ("0") 01 | 100 |
| ("1") 01 | 001 |
| 00.00 | 010.001 |
| 00.01 | 010.000 |
| ("0") 00.11 | 100.001 |
| ("1") 00.11 | 000.000 |
| ("0") 00.10 | 100.000 |
| ("1") 00.10 | 000.001 |

[ ("0") MEANS THAT IMMEDIATELY PRECEDING CODE BIT IS 0 ]
[ ("1") MEANS THAT IMMEDIATELY PRECEDING CODE BIT IS 1 ]

FIG.24

| Data | Code |
| --- | --- |
| 11 | 010 |
| ("0") 10 | 101 |
| ("1") 10 | 000 |
| ("0") 00 | 100 |
| ("1") 00 | 001 |
| 01.01 | 010.001 |
| 01.00 | 010.000 |
| ("0") 01.10 | 100.001 |
| ("1") 01.10 | 000.000 |
| ("0") 01.11 | 100.000 |
| ("1") 01.11 | 000.001 |

[ ("0") MEANS THAT IMMEDIATELY PRECEDING CODE BIT IS 0 ]
[ ("1") MEANS THAT IMMEDIATELY PRECEDING CODE BIT IS 1 ]

FIG.25

| Data | Code |
|---|---|
| 11 | 010 |
| ("0") 00 | 101 |
| ("1") 00 | 000 |
| ("0") 10 | 100 |
| ("1") 10 | 001 |
| 01.01 | 010.001 |
| 01.10 | 010.000 |
| ("0") 01.00 | 100.001 |
| ("1") 01.00 | 000.000 |
| ("0") 01.11 | 100.000 |
| ("1") 01.11 | 000.001 |

[ ("0") MEANS THAT IMMEDIATELY PRECEDING CODE BIT IS 0 ]
[ ("1") MEANS THAT IMMEDIATELY PRECEDING CODE BIT IS 1 ]

FIG.26

| MAX. NO. OF MIN. RUNS IN SEQUENCE | SHANNON CAPACITY |
|---|---|
| 1 | 0.6307 |
| 2 | 0.6623 |
| 3 | 0.6730 |
| 4 | 0.6769 |
| 5 | 0.6784 |
| 6 | 0.6789 |

FIG.29

| 1 | 010/3 | 010/6 | 100/3 | 100/6 |
| 2 | 010/3 | 010/6 | 000/3 | 000/6 |
| 3 | 000/1 | 000/4 | 000/5 | 000/7 |
| 4 | 010/1 | 010/4 | 010/5 | 010/8 |
| 5 | 100/1 | 100/4 | 100/5 | 100/7 |
| 6 | 001/2 | 001/3 | 001/4 | 001/6 |
| 7 | 101/2 | 101/3 | 101/4 | 101/6 |
| 8 | 101/2 | 101/3 | 101/6 | 000/6 |

FIG.31

| TYPE | CONSTRAINT LENGTH 5 | CONSTRAINT LENGTH 4 |
|---|---|---|
| 1 | 389,120 | 4,096 (128) |
| 2 | 389,120 | 4,096 (128) |
| 3 | 389,120 | 4,096 (256) |

FIG.32

| | 00 | 01 | 10 | 11 |
|---|---|---|---|---|
| 1 | 010/3 | 010/6 | 100/6 | 100/3 |
| 2 | 010/3 | 010/6 | 000/3 | 000/6 |
| 3 | 000/5 | 000/1 | 000/7 | 000/4 |
| 4 | 010/5 | 010/1 | 010/8 | 010/4 |
| 5 | 100/5 | 100/1 | 100/7 | 100/4 |
| 6 | 001/6 | 001/2 | 001/3 | 001/4 |
| 7 | 101/6 | 101/2 | 101/3 | 101/4 |
| 8 | 101/6 | 101/2 | 101/3 | 000/6 |

FIG.33

| Data | Code |
|---|---|
| ("010") 10.11 | 000.001 |

[ ("010") MEANS THAT IMMEDIATELY PRECEDING CODE WORD IS 010 ]

FIG.34

| CODE CONVERSION TABLE | NO. OF STATES | CODE WORD CONSTRAINT LENGTH (IN BLOCKS) | ERROR PROPAGATION LENGTH (IN BITS) |
|---|---|---|---|
| FIGS. 20 TO 22 | 7 | 3 | 6 |
| FIG. 33 | 8 | 4 | 7 |

FIG. 35

ENCODING APPARATUS AND METHOD, RECORDING MEDIUM AND PROGRAM

This is a division of prior application Ser. No 10/799,893 filed Mar. 10, 2004 is now U.S. Pat. No. 6,891,483.

BACKGROUND OF THE INVENTION

1. Field of the Invention

The present invention generally relates to a coding apparatus and method, recording medium and a program, and more particularly to a coding apparatus and method, recording medium and a program, suitable for use in converting an m-bit information word continuously into an n-bit code word with DC control bits for DC control of a code sequence being inserted in a sequence of information.

This application claims the priority of the Japanese Patent Application No. 2003-079556 filed on Mar. 24, 2003, the entirety of which is incorporated by reference herein.

2. Description of the Related Art

Many of various types of recorder/players and communications devices are designed for a reduced rate of errors, caused by coding of input information, of digitally transmitted information.

Referring now to FIG. 1, there is schematically illustrated in the form of a block diagram a digital signal processing circuit included in a typical conventional recorder/player indicated with a reference 1.

As shown, the digital signal processing circuit of the recorder/player 1 includes an encoder 11. The encoder 11 encodes an information sequence continuously supplied into a ratio of m:n (m is data bit length before coding, and n is a data bit length after coding) to generate a sequence of binary recording codes. It should be noted here that "m", "n" and "m-n" will be referred to as "information word length", "code word length" and "code rate" or "coding rate", respectively.

The digital signal processing circuit includes also a recording/playback unit 12. The recording/playback unit 12 is composed of a magnetic head, optical pickup, control circuit to control the driving of the magnetic head and optical pickup, etc. to records a recording code supplied from the encoder 11 to a recording medium (not shown). Also, the recording/playback unit 12 reads a signal from the recording medium, and outputs a reproduced analog wave to an analog equalizer 13 also included in the digital signal processing circuit. The analog equalizer 13 equalizes the reproduced wave from the recording/playback unit 12 to a predetermined target equalization characteristic.

The digital signal processing circuit includes also an A-D converter 14. The A-D converter 14 converts the supplied equalized signal into a digital read signal. As shown, the A-D converter 14 includes a PLL (phase-locked loop). This PLL may be a hybrid digital PLL that makes only a phase error detection in a digital section thereof or a full-digital PLL that makes both a phase error detection and a signal synchronization in a digital section thereof.

Also, in case the equalization by the analog equalizer 13 is not sufficient, a digital equalizer may be provided between the A-D converter 14 and a code detector 15 also included in the digital signal processing circuit. It should be noted that in this case, a lowpass filter may be provided in place of the analog equalizer 13.

The above code detector 15 is supplied with a digital read signal (equalize signal) and converts it into a code (namely, it detects a code). Recently, it has become a common way to use a soft-decision detector such as a Viterbi detector or the like for the code detector 15. A decoder 16 also included in the digital signal processing circuit is supplied with a detection code continuously supplied, decodes it into a detection in formation in a ratio of n:m, and outputs the detection information as a sequence of detection information.

As shown in FIG. 1, various codes are used in practice in the coding effected in the encoder 11. Many different types of recorder/players adopt, for example, a (d, k) RLL (run-length limited) code in which d is a minimal number of 0's between 1's in a code sequence (minimum run) and k is a maximum number of 0's between 1's (maximum run) as in the NRZI (nonreturn-to-zero-inverted recording) modulation in which a recorded rectangular wave is inverted on one bit.

Especially in many optical players using an optical pickup for reading signals, a minimum run-length limited code with a minimum run d of more than one "0" is used to reduce the deterioration in quality of a read signal, due to the nonlinearity of the optical pickup. The compact disk (CD) recorder/players and music-playing mini disk (MD) recorder/players, having been popular, employ a (2, 10) RLL code of 8/17 in coding ratio called "EFM (eight to fourteen modulation)", and the MD DAT2 used in the data-recording mini disk recorder/players adopt a (1, 7) RLL code of 2/3 in coding rate, for example.

Also, the (d, k) RLL code is not adopted only in the recorder/players. A (1, 13) RLL code of ⅔ in coding rate is employed in the radio communications device using an infrared ray called "IrDA-VFlr (infrared data association, very fast infrared), for example.

Of the (d, k) RLL codes, the EFM code is a fixed-length code and the (1, 7) RLL code is a variable-length code. Generally, the variable-length code is encoded based on either a look-ahead code conversion table or a finite-state code conversion table.

FIGS. 2 and 3 show the well-known look-ahead code conversion tables of the (1, 7) RLL codes (by Cohn-Jacoby-Bates). FIG. 2 shows a basic code conversion table, and FIG. 3 shows an irregular code conversion table. An information sequence is encoded according to the basic code conversion table in FIG. 2. When an information sequence as listed in the irregular code conversion table in FIG. 3 is supplied, the irregular code conversion table in FIG. 3 is preferentially applied to encode the information sequence (see the U.S. Pat. No. 4,337,458 to M. Cohn, G. Jacoby and C. Bates, for example).

On the assumption that one block is a minimum unit of coding (equivalent to 2 bits of input information or 3 bits of code in the basic code conversion table in FIG. 2, for example), the encoder 11 that encodes information according to the code conversion tables in FIGS. 2 and 3 has to look ahead an information sequence for one block in order to encode information. Also, the look-ahead code conversion tables in FIGS. 2 and 3 can be converted into finite-state code conversion tables, respectively, by re-assigning, to an information word, a code word having been made to lag behind the information word by the same amount as a necessary look-ahead amount for the encoder 11.

Note here that the above "re-assignment of a code word made to lag behind an information word by one block" is to assign a code work 001 to an information word 00 while a preceding information word is 10 since two code words 001 and 000 are assigned to two information words 10 and 00, respectively, as in FIG. 3.

FIG. 4 shows a finite state-type 5-state code conversion table for (1, 7) RLL codes converted according to the look-ahead code conversion tables in FIGS. 2 and 3. In FIG. 4, three bits shown before a slash (/) indicate a code word and a figure shown after the slash indicates a transition.

That is, the finite-state code conversion table in FIG. 4 is derived from assignment of a 3-bit code word made to lag one block to an information word each of 2 bits in the look-ahead code conversion tables in FIGS. 2 and 3 (see the article "The Power Spectrum of Run-Length-Limited Codes" by A. Gallopoulos, C. Heegard and P. Siegel, IEEE Trans. on Com., Vol. 37, No. 9, pp. 906–917, September 1989, for example).

In case the encoder 11 has encoded information according to the look-ahead code conversion tables in FIGS. 2 and 3, it can output only a code word delayed one block in relation to a code word assigned to an input information word by one block for looking ahead the information word. Also, in case the encoder 11 has encoded information according to the finite-state code conversion table 4, it is necessary to look ahead any information word. However, the finite-state code conversion table in FIG. 4 is different from the code conversion tables in FIGS. 2 and 3 in that a code word delayed one block is assigned to an information word.

That is, a code sequence resulted from encoding an information sequence according to the look-ahead code conversion tables in FIGS. 2 and 3 will be identical to a code sequence resulted from encoding according to the finite-state code conversion table in FIG. 4. Therefore, the look-ahead code conversion table and finite-state code conversion table appear to present different codes, respectively, but they are different only in notation of a coding rule from each other. However, on the assumption that the internal circuit of the encoder 11 is constructed in faithful accordance with the coding rule of the code conversion tables, the encoder 11 will be different in circuit construction from each other depending upon which the code conversion table adopted is, a look-ahead or finite state-type one.

Also, in case the code is not of a variable length but of a fixed length, the code conversion table is of the finite state type alone since an information sequence has not to be looked ahead. It can be discriminated depending upon which the same code word is assigned to, a plurality of information words or a single information word, whether a code represented according to the finite-state code conversion table is a variable-length one or a fixed-length one.

Also, although the look-ahead code conversion table has to be designed by a heuristic approach, the finite-state code conversion table can theoretically be designed with the use of a method called "ACH (Adler-Coppersmith-Hassner) algorithm".

The ACH algorithm used for designing a finite-state code conversion table will be explained herebelow. In the ACH algorithm, a number of bits of a target code word is first taken as a parameter and a vector called "approximate characteristic vector" having dimensions corresponding to a number of states is determined based on a finite state transition diagram of the code. Next, there is prepared a finite states table including the same number of finite states in the finite state transition diagram as that of elements in the approximate characteristic vector, and then each of operations called "state splitting" and "state merging" is repeated to finally provide a simplified finite states table.

In the ACH algorithm, multiple approximate characteristic vectors exist and the last finite states table determined varies depending upon the first approximate characteristic vector determined. Since there are many options in each of the state splitting and state merging operations, however, using the same approximate characteristic vector will not always result in the same last finite states table.

By appropriately assigning each code in a finite states table thus obtained to necessary information word, it is possible to provide a finite-state code conversion table. Also, all codes designed by this method have a finite code word constraint length and can be decoded independently of any state. That is, it is well known that a code designed by the method is sliding-block decodable.

The ACH algorithm is referred in detail to the article "Algorithm for Sliding Block Codes" by R. Adler, D. Coppersmith and M. Hassner, IEEE Trans. on Information Theory, Vol. IT-29, No. 1, pp. 5–22, January 1983, for example.

FIG. 5 shows an 8-state finite state transition diagram premised on the NRZI modulation and which provides a (1, 7) RLL code. It should be noted here that a state number in the finite state transition diagram shown in FIG. 5 does not corresponding to a state number in the finite-state code conversion table.

Generally, two approximate characteristic vectors [2, 3, 3, 3, 2, 2, 2, 1] and [3, 5, 5, 4, 4, 4, 3, 2] are known as 8-dimensional ones determined according to the finite state transition diagram in FIG. 5. The value of each element in the approximate characteristic vector indicates a number by which each state in the finite state transition diagram (a so-called number of stet stripping) is first divided. For example, the 5-state code conversion table in FIG. 4 can be determined according to the look-ahead code conversion tables in FIGS. 2 and 3 and also theoretically as an approximate characteristic vector [3, 5, 5, 4, 4, 4, 3, 2] using an ACH algorithm determined according to the finite state transition diagram in FIG. 5. On the other hand, by determining a finite-state code conversion table using the ACH algorithm as the approximate characteristic vector [2, 3, 3, 3, 2, 2, 2, 1], there can be provided a 4-state finite-state code conversion table.

FIG. 6 shows a finite-state 4-state code conversion table of a (1, 7) RLL code by Weathers-Wolf. The code conversion table in FIG. 6 is known as a minimum-state finite-state code conversion table of the (1, 7) RLL code (see the article "A New Rate 2/3 Sliding Block Code for the (1, 7) Runlength Constraint with the Minimal Number of Encoder States" by A. D. Weathers and J. K. Wolf, IEEE Trans. on Info. Theory, Vol. 37, No. 3, pp. 908–913, May 1991, for example).

Generally in an optical disk recorder/player or an optical disk player, low-frequency component of a code spectrum has to be suppressed to some extent to extract a servo signal used in a low-frequency band. Since a low-frequency component of a read signal in a data area is superposed as a noise on the extracted servo signal if the low-frequency component of the code spectrum is not suppressed at all, the servo signal will have the quality thereof deteriorated considerably.

The low-frequency component of a code spectrum can effectively be suppressed by controlling the DC component of a code sequence so that a running digital sum (RDS) of the code sequence will have a digital-sum variation (DSV) as small as possible. The "RDS" referred to herein is a sum of code polarities represented by ±1 in a modulated recording code sequence or transmission code sequence, namely, in a code sequence after NRZI-modulated in case the code sequence is based on the NRZI modulation.

Conventionally, the DC control of a code sequence is done using primarily the following three methods:

The first one of the methods is to encode data irrespectively of the DSV of a code sequence to be checked the RDS of the code sequence, and then insert DC control bits at constant intervals into the code sequence so that the DSV of the code sequence is as small as possible. On the assumption that the DC control bit is an RLL control bit as the case may be, however, the insertion of DC control bits may be followed by a first coding so that the RLL limitation on the code sequence can be kept.

The codes to which the above first method is applicable include the previously mentioned EFM code actually used in CD and MD, for example. In the case of EFM code, however, if a certain information sequence is given continuously, any DC control cannot be done to keep the limitation on a (2, 10) RLL code and DSV of the code will not be finite in some cases. However, since commonly used input information has a high randomness, the above will not be any practical problem.

The above first method is advantageous in that it is applicable to an arbitrary RLL code. However, a large number of DC control bits has to be inserted into a code sequence in order to keep the RLL limitation and thus the code redundancy including the influence of the DC control bits is apt to be increased.

The second one of the above three methods is to pre-design a code conversion table of a finite state type so that the DSV of a code sequence will be as small as possible. The codes to which the second method is applicable include a (2, 10) RLL code called "EFMPlus" used to convert an 8-bit information word into a 16-bit code word. This EFMPlus code is actually used as a recording code for DVD (digital versatile disk). The aforementioned EFM code is of a fixed length. On the other hand, the EFMPlus code has a variable length in which a plurality of information words is assigned the same code word.

However, an EFMPlus code includes 256 information words, of which only 95 are DC-controllable. If any ones of the other 161 information words are successively included in the EFMPlus code, the DSV will not be finite. Also in this case, however, input information used has a high randomness as a rule as in the above-mentioned EFM code. Thus the above will not be any problem.

The second one of the aforementioned methods is advantageous in which it is not necessary to insert any DC control bit. For some codes, it is difficult to design a code conversion table with a high coding rate. In many cases, the code conversion table is so complex that the encoder and decoder are complex in construction.

The third method is to pre-assign a code word to an information word so that two's complement of a sum of information words coincides with that of a sum of code words and insert DC control bits at constant intervals into an information sequence so that the DSV of a code sequence is as small as possible. After a code word is assigned by the third method, the inversion of a code following a DC control bit to be inserted is assured whether the DC control bit is 0 or 1. Thus, a code sequence can be DC-controlled efficiently.

The code word assignment by the third method is called "PP (parity preserving) word assignment" because it is done in such a manner that the parity of an information sequence always coincides with that of a code sequence.

More specifically, the PP word assignment worked by Kahlman and Immink in 1994 is such that in the look-ahead code conversion table, code words are assigned to information words in order to meet the following expression (1) (see the U.S. Pat. No. 5,477,222 to J. Kahlman and A, Immink, for example):

$$p = q \quad (1)$$

where p is a complement of a sum of information words and q is a complement of a sum of code words.

In the third method, any DC control bits inserted in an information sequence will not disturb the RLL limitation on a code sequence. Thus, when suppressing low-frequency components of a code spectrum with an equal effect, adoption of the third method will often permit to reduce the redundancy of the DC control bits as compared with the first method in which DC control bits are inserted in a code sequence.

In the third method, however, the inversion of a code sequence is assured through selection of DC control bits but the inversion of the RDS within a control interval is not always assured. Therefore, if information pieces whose RDS polarity will not be inverted are supplied successively whether either 0 or 1 is selected as a DC control bit, the DSV will not be finite as the case may be. However, since commonly used input information has a high randomness similarly to the aforementioned EFM and EFMPlus codes, the above will not be any practical problem.

Also, in case the DC control method of inserting DC control bits into an information sequence is used, the RDS polarity of a code sequence can be inverted with a certain probability even if the PP code word assignment is not doe in a look-ahead code conversion table used, the DC control of the code sequence is not quite impossible. That is, the PP code word assignment can advantageously be used because a code sequence can be subjected to an efficient DC control by considerably increasing the probability in inversion of the RDS of the code sequence at the time DC control bits are inserted into an information sequence.

For a practical PP assignment of codes in the code conversion table, only the look-ahead code conversion table is known. Namely, for the finite-state code conversion table determined from the ACH algorithm, there is known no PP code word assignment method, which was definitely stated by K. Immink, one of the Inventors of the PP code word assignment (see "Codes for Mass Data Storage" by K. Immink, Shannon Foundation Publishers, Netherlands, p. 290, 1999).

Also, the code represented according to the first look-ahead code conversion table for the PP code word assignment, disclosed in the above U.S. Pat. No. 5,477,222, was a (1, 8) RLL code. Currently, it is known that a look-ahead code conversion table for the PP code word assignment can be designed for the (1, 7) RLL code as well.

FIGS. 7 and 8 show look-ahead code conversion tables for the PP code word assignment of the (1, 7) RLL code.

FIG. 7 shows a basic data conversion table for use to encode an information sequence in normal times, and FIG. 8 shows an irregular code conversion table for use to encode an information sequence at a fault. When an information sequence is encoded according to the basic code conversion table in FIG. 7, it results in a (1, 8) RLL code. Coding the (1, 8) RLL code according to the irregular code conversion table in FIG. 8 results in a (1, 7) RLL code. In other words, in case an information sequence as in the irregular code conversion table is supplied for coding, the irregular code conversion table in FIG. 8 is used for the (1, 7) RLL code preferentially over the basic code conversion table in FIG. 7. In any of the basic code conversion table in FIG. 7 and irregular code conversion table in FIG. 8, the two's complement of a sum of information words completely coincides with that of a sum of code words (see the Japanese Published Unexamined Patent Application No. 1999-346154, for example).

As described in the above Japanese Published Unexamined Patent Application No. 1999-346154, a long sequence of minimum runs adversely affects the bit error rate when a defocusing, tangential tilt or the like has occurred in the optical disk recorder/player or optical disk player. On this account, it has been proposed to limit the maximum number of minimum runs in sequence to six (6) by adding the irregular code conversion table to the look-ahead code conversion tables in FIGS. 7 and 8. It should be noted here that in a code sequence "001(01)r00", r≦R where (01)r is a representation of (01) repeated r times in succession and R is a maximum number of minimum runs are repeated R times in succession on the assumption that the minimum run is "1" and the modulation method is the NRZI modulation, for example.

FIG. 9 shows a look-ahead irregular code conversion table to which the PP code word assignment is applied. This look-ahead irregular code conversion table is added to the basic code conversion table and irregular code conversion table in FIGS. 7 and 8 to limit the maximum number of minimum runs in sequence of a (1, 7) RLL code to six (6).

Also in the irregular code conversion table in FIG. 9, the two's complement of a sum of information words coincides with that of a sum of code words. By encoding information under the coding rule adopted in the code conversion tables in FIGS. 7 and 8 and also that in the irregular code conversion table in FIG. 9, it is possible to limit the maximum number of minimum runs in sequence to six (6) with the PP code word assignment being maintained.

The (1, 7) RLL code represented according to the look-ahead code conversion tables shown in FIGS. 7, 8 and 9 and to which the PP code word assignment is applied is adopted in the recording code for the Blu-ray which is the next-generation optical disk recorder/player.

As above, the PP (parity preserving) code word assignment is one of the excellent techniques for efficient DC control of a code sequence. More precisely, the PP code word assignment has to be done according to look-ahead code conversion tables and designed by a heuristic approach. For this reason, there have been known very few code conversion tables actually using the PP code word assignment.

On the other hand, the finite-state code conversion table can theoretically be designed using the ACH algorithm. Therefore, if a code word assignment method effective similarly to the PP code word assignment used in the look-ahead code conversion table can be found, it is possible to theoretically design a code conversion table superb in DC control efficiency.

Also, techniques for conversion of a look-ahead code conversion table into a finite-state code conversion table have been disclosed for conversion of variable-length codes, but there has been disclosed no technique for conversion of a finite-state code conversion table into a look-ahead code conversion table. Namely, no concrete ways of such conversions are yet known. If a finite-state code conversion table can be convened into a look-ahead code conversion table, it will be possible to easily make clear the differences between the code word assignment in the aforementioned finite-state code conversion table and the conventional PP code word assignment.

For encoding information under the coding rule in a look-ahead code conversion table in which the PP code word assignment having been disclosed heretofore is used, the construction of the aforementioned encoder 11 will be more complicated than in case the conventional coding method is used in the look-ahead code conversion table.

For example, in the look-ahead code conversion tables in FIGS. 7 and 8, the necessary looked-ahead amount of an information sequence is 3 blocks. So, when a code word delayed 3 blocks is converted into a finite-state code conversion table via re-assignment to an information word, it will have 104 states. In the encoder 11, the coding rule of the finite-state code conversion table should not always be checked. However, since the large number of states as a result of the conversion to the finite-state code conversion table means the coding rule of the look-ahead code conversion table is complex, the construction of the encoder 11 will be complicated as a rule.

Especially when the maximum number of minimum runs in sequence is limited finitely, the encoder 11 will be constructed to be very complicated. For example, in case the look-ahead code conversion table in FIG. 9 is combined with the look-ahead code conversion tables having been described above with reference to FIGS. 7 and 8, the necessary looked-ahead amount of an information sequence is 5 blocks. So, when the information sequence is converted into a finite-state code conversion table via re-assignment of a code word delayed 5 blocks to an information word, it will have 1691 states. This number of states is very large.

Further, in case information is encoded according to a look-ahead code conversion table using the PP code word assignment technique having been proposed so face, the decoded code word constraint length will be larger than a decoded code word length resulted from a coding done according to the code conversion tables in FIGS. 2 and 3 and code conversion table in FIG. 6, for example. It should be noted here that the "decoded code word constraint length" is a number of blocks in a necessary code word that has to be held for sliding-block decoding.

As the decoded code word constraint length is larger, the decoder 16 is not only constructed to be more complex but the decoded error propagation length is larger and bit error rate after the decoding is worse. It should be noted here that the "decoded error propagation length" is a maximum number of bits whose one-bit error will possibly be propagated from a code sequence to an information sequence. Even in case the maximum number of minimum runs in sequence is limited finitely, the above problem will similarly occur.

FIG. 10 shows results of calculation of the number of code states at the time of coding, code word constraint length at the time of decoding and decoded error propagation length at the time of decoding in case the (1, 7) RLL code having been described with reference to FIGS. 2 to 9 is used. It should be noted however that in FIG. 10, the numbers of states in a combination of the code conversion tables in FIGS. 7 and 8 and a combination of the code conversion tables in FIGS. 7, 8 and 9, respectively, are those resulted from conversion of these look-ahead code conversion tables into a finite-state code conversion table with the aforementioned technique.

As will be seen in FIG. 10, the (1, 7) RLL code encoded under the coding rule in the combination of the code conversion tables in FIGS. 7 and 8 or that of the code conversion tables in FIGS. 7, 8 and 9, has 104 or 1691 code states at the time of coding, which is more than 20 times larger than the five states having been described with reference to the code conversion tables in FIGS. 2 and 3 or the code conversion table in FIG. 4 and than the four states having been described with reference to the code conversion table in FIG. 6. Also, as will be seen, the (1, 7) RLL code encoded under the coding rule in the combination of the code conversion tables in FIGS. 7 and 8 or that of the code conversion tables in FIGS. 7, 8 and 9, each using the PP code word assignment, has a decoded code word constraint length and decoded error propagation length about 2 times larger than those the (1, 7) RLL code encoded according to the code conversion tables in FIGS. 2 and 3, that in FIG. 4 or that in FIG. 6, and all the (1, 7) RLL codes thus encoded are considerably deteriorated.

That is, a code represented according to the look-ahead code conversion table using the already proposed PP code word assignment is more largely deteriorated in number of code states at the time of coding, code word constraint length at the time of decoding and error rate propagation length at the time of decoding than a code in which no PP code word assignment is effected. It has been demanded to improve these values.

Also, if the maximum number of minimum runs in sequence can be reduced, it is possible to effectively improve the bit error rate even if a defocusing, tangential tilt or the like occurs in an optical disk (recorder) player. However, the maximum number of minimum runs in sequence of the (1, 7) RLL code, that could be attained, is six. There has not been disclosed any technique for making the maximum number of minimum runs in sequence of the (1, 7) RLL code smaller than six.

OBJECT AND SUMMARY OF THE INVENTION

It is therefore an object of the present invention to overcome the above-mentioned drawbacks of the related art by providing a coding method of converting an m-bit information word continuously into an n-bit word by inserting, into an information sequence, DC control bits for DC control of a code sequence in which the maximum number of minimum runs in sequence of the (1, 7) RLL code can be made smaller than the conventional one (six) by making the number of code states at the time of coding smaller than ever and the code word constraint length at the time of decoding and error propagation length at the time of decoding smaller than ever.

The above object can be attained by providing an encoder including according to the present invention:

an information sequence generating means for generating a first information sequence by inserting first DC control bits into an input information sequence at predetermined intervals and a second information sequence by inserting second DC control bits different from the first DC control bits into the input information sequence at the predetermined intervals;

a first code converting means for generating a first provisional code sequence by making a code conversion of the first information sequence generated by the information sequence generating means at a conversion ratio of an information word length m to an code word length n;

a second code convening means for generating a second provisional code sequence by making a code conversion of the second information sequence generated by the information sequence generating means at the conversion ratio of the information word length m to the code word length n; and a selecting means for selecting either the first provisional code sequence generated by the first code convening means or the second provisional code sequence generated by the second code converting means, the first and second code converting means using a coding rule by which, in case the coding rule is represented by a finite-state code conversion table, code words are assigned to information words so that the two's complement of a sum of coding bits included in the first provisional code sequence is always different from that of a sum of coding bits included in the second provisional code sequence when a first code state of the first provisional code sequence encoded starting with a predetermined original state, is identical to a second code state of the second provisional code sequence encoded starting with the predetermined original state.

In the above encoder, the first and second cove converting means may be designed to make a code conversion with an information word length m of 2 bits and in code conversion units of 2 bits.

Also in the above encoder, the first and second code converting means may use a coding rule by which the code words are assigned to the information words so that when the first code state is identical to the second code state, the two's complement of the sum of coding bits included in the first provisional code sequence is always different from that of the sum of coding bits included in the second provisional code sequence whether the first and second DC control bits are inserted at the first or second bit of the code conversion unit by the information sequence generating means.

Also in the above encoder, the first and second code converting means may use a coding rule by which the code words are assigned to the information words so that when the first code state is identical to the second code state, the two's complement of the sum of coding bits included in the first provisional code sequence is always different from that of the sum of coding bits included in the second provisional code sequence when the first and second DC control bits are inserted at the first bit of the code conversion unit by the information sequence generating means.

Also in the above encoder, the first and second code convening means may use a coding rule by which the code words are assigned to the information words so that when the first code state is identical to the second code state, the two's complement of the sum of coding bits included in the first provisional code sequence is always different from that of the sum of coding bits included in the second provisional code sequence when the first and second DC control bits are inserted at the second bit of the code conversion unit by the information sequence generating means.

Also in the above encoder, the first and second code converting means may be designed to encode information with an information word length m of one block and in units of one block, and the first and second code convening means using a coding rule by which, in case the coding rule is represented by a look-ahead code conversion table, code words are assigned to information words so that the two's complement of a sum of coding bits included in an information sequence is different from that of a sum of coding bits included in a provisional code sequence when the number of blocks is odd while the two's complement of a sum of coding bits included in an information sequence coincides with that of a sum of coding bits included in a provisional code sequence when the number of blocks is even.

Also in the above encoder, the first and second code converting means may be designed to make a code conversion with an information word length of 2 bits taken as one block and in units of one block under a coding rule in which the information word has a length m of 2 bits, code word has a length n of 3 bits and the maximum run is limited to 7.

Also in the above encoder, the first and second code converting means may use a coding rule in which, in case the coding rule is represented by a finite-state code conversion table, the number of states is seven.

Also in the above encoder, the first and second code converting means may be designed to make a code conversion so that the decoded code word constraint length is 3 blocks.

Also in the above encoder, the first and second code converting means may use a coding rule in which the minimum run is limited to one, maximum run is limited to seven and the maximum number of minimum runs in sequence of code words is five and, in case the coding rule is represented by a code conversion table, the number of states is eight.

Also the above encoder may further comprise a code select signal generating means for calculating the DSV of the first provisional code sequence and that of the second provisional code sequence and generating a code select signal indicative of the provisional code sequence whose DSV is smaller, and the selecting means selects the provisional code sequence whose DSV is smaller according to the code select signal.

Also the above object can be attained by providing a coding method including, according to the present invention, the steps of:

generating a first information sequence by inserting first DC control bits into an input information sequence at predetermined intervals and a second information sequence by inserting second DC control bits different from the first DC control bits into the input information sequence at the predetermined intervals;

generating a first provisional code sequence by making a code conversion of the first information sequence generated in the information sequence generating step at a conversion ratio of an information word length m to an code word length n;

generating a second provisional code sequence by making a code conversion of the second information sequence generated in the information sequence generating step at the conversion ratio of the information word length m to the code word length n; and selecting either the first provisional code sequence generated in the first code converting step or the second provisional code sequence generated in the second code convening step, the first and second code convening steps using a coding rule by which, in case the coding rule is represented by a finite-state code conversion table, code words are assigned to information words so that the two's complement of a sum of coding bits included in the first provisional code sequence is always different from that of a sum of coding bits included in the second provisional code sequence when a first code state of the first provisional code sequence encoded starting with a predetermined original state, is identical to a second code state of the second provisional code sequence encoded starting with the predetermined original state.

Also the above object can be attained by providing a recording medium having recorded therein a coding program having a computer convert a sequence of m-bit information words into a sequence of n-bit code words, the program including, according to the present invention, the steps of:

generating a first information sequence by inserting first DC control bits into an input information sequence at predetermined intervals and a second information sequence by inserting second DC control bits different from the first DC control bits into the input information sequence at the predetermined intervals;

generating a first provisional code sequence by making a code conversion of the first information sequence generated in the information sequence generating step at a conversion ratio of an information word length m to an code word length n;

generating a second provisional code sequence by making a code conversion of the second information sequence generated in the information sequence generating step at the conversion ratio of the information word length m to the code word length n; and selecting either the first provisional code sequence generated in the first code converting step or the second provisional code sequence generated in the second code converting step, the first and second code convening steps using a coding rule by which, in case the coding rule is represented by a finite-state code conversion table, code words are assigned to information words so that the two's complement of a sum of coding bits included in the first provisional code sequence is always different from that of a sum of coding bits included in the second provisional code sequence when a first code state of the first provisional code sequence encoded starting with a predetermined original state, is identical to a second code state of the second provisional code sequence encoded starting with the predetermined original state.

Also the above object can be attained by providing a coding program for convening an m-bit information word into an n-bit code word, the program including, according to the present invention, the steps of:

generating a first information sequence by inserting first DC control bits into an input information sequence at predetermined intervals and a second information sequence by inserting second DC control bits different from the first DC control bits into the input information sequence at the predetermined intervals;

generating a first provisional code sequence by making a code conversion of the first information sequence generated in the information sequence generating step at a conversion ratio of an information word length m to an code word length n;

generating a second provisional code sequence by making a code conversion of the second information sequence generated in the information sequence generating step at the conversion ratio of the information word length m to the code word length n; and selecting either the first provisional code sequence generated in the first code converting step or the second provisional code sequence generated in the second code converting step, the first and second code converting steps using a coding rule by which, in case the coding rule is represented by a finite-state code conversion table, code words are assigned to information words so that the two's complement of a sum of coding bits included in the first provisional code sequence is always different from that of a sum of coding bits included in the second provisional code sequence when a first code state of the first provisional code sequence encoded starting with a predetermined original state, is identical to a second code state of the second provisional code sequence encoded starting with the predetermined original state.

Also the above object can be attained by providing an encoder including according to the present invention:

an input means for receiving an m-bit information word;

a coding means for encoding the m-bit information word into an n-bit code word under a coding rule in which the minimum run is limited to one, maximum run is limited to seven and the maximum number of minimum runs in sequence of decoded code words is three to five; and an output means for outputting the n-bit code words.

In the above encoder, coding means may use a coding rule in which, in case the coding rule is represented by a code conversion table, the number of states is eight and the maximum number of minimum runs in sequence is five.

Also in the above encoder, the coding means may be designed to encode the m-bit information words with a decoded code word constraint length of 4 blocks.

Also the above object can be attained by providing a coding method including, according to the present invention, the steps of:

receiving an m-bit information word;

encoding the m-bit information word into an n-bit code word under a coding rule in which the minimum run is limited to one, maximum run is limited to seven and the maximum number of minimum runs in sequence of a decoded code word is three to five; and outputting the n-bit code words.

Also the above object can be attained by providing a recording medium having recorded therein a coding program, the program including, according to the present invention, the steps of:

receiving an m-bit information word;

encoding the m-bit information word into an n-bit code word under a coding rule in which the minimum run is limited to one, maximum run is limited to seven and the maximum number of minimum runs in sequence of a decoded code word is three to five; and outputting the n-bit code words.

Also the above object can be attained by providing a coding program for converting an m-bit information word continuously into an n-bit code word, the program including, according to the present invention, the steps of:

receiving an m-bit information word;

encoding the m-bit information word into n-bit code word under a coding rule in which the minimum run is limited to one, maximum run is limited to seven and the maximum number of minimum runs in sequence of a decoded code word is three to five; and outputting the n-bit code words.

These objects and other objects, features and advantages of the present invention will become more apparent from the following detailed description of the preferred embodiments of the present invention when taken in conjunction with the accompanying drawings.

BRIEF DESCRIPTION OF THE DRAWINGS

FIG. 2 explains the look-ahead code conversion table for the (1, 7) RLL code;

FIG. 3 also explains the look-ahead code conversion table for the (1, 7) RLL code;

FIG. 4 explains the finite state-type 5-state code conversion table resulted from conversion of the code conversion tables in FIGS. 2 and 3;

FIG. 6 explains the finite state-type 4-state code conversion table for the (1, 7) RLL code;

FIG. 7 explains the look-ahead code conversion table using the PP (parity presenting) code word assignment of the (1, 7) RLL code;

FIG. 8 also explains the look-ahead code conversion table using the PP code word assignment of the (1, 7) RLL code;

FIG. 9 explains the irregular code conversion table that is to be added to each of the code conversion tables in FIGS. 7 and 8 to limit the maximum number of minimum runs in sequence to six;

FIG. 10 explains the number of states, code word constraint length and error propagation length of the conventional (1, 7) RLL code;

FIG. 14 explains the states of two sequences during coding made in the encoder in FIG. 12;

FIG. 15 explains a 7-state finite state table for the (1,7) RLL code;

FIG. 18 explains acceptable numbers of code words assignments per block length;

FIG. 19 explains a type classification of acceptable code word assignment, not dependent upon any block length;

FIG. 20 explains a first acceptable example of the finite state-type 7-state code conversion table of the (1, 7) RLL code;

FIG. 21 explains a second acceptable example of the finite state-type 7-state code conversion table of the (1, 7) RLL code;

FIG. 22 explains a third acceptable example of the finite state-type 7-state code conversion table of the (1, 7) RLL code;

FIG. 23 explains the states of two sequences during coding made in the encoder in FIG. 12;

FIG. 24 explains an acceptable look-ahead code conversion table for the (1, 7) RLL code, resulted from conversion of the code conversion table in FIG. 20;

FIG. 25 explains an acceptable look-ahead code conversion table for the (1, 7) RLL code, resulted from conversion of the code conversion table in FIG. 21;

FIG. 26 explains an acceptable look-ahead code conversion table for the (1, 7) RLL code, resulted from conversion of the code conversion table in FIG. 22;

FIG. 29 explains the maximum number of minimum runs in sequence, and the Shannon capacity;

FIG. 31 explains an 8-state finite state table for the (1, 7) RLL code, in which the maximum number of minimum runs in sequence is limited to five;

FIG. 32 explains a number of acceptable code word assignments by type classification, not dependent upon any block length;

FIG. 33 explains a finite state-type 8-state code conversion table for the (1, 7) RLL code, in which the maximum number of minimum runs in sequence is limited to five;

FIG. 34 explains an irregular code conversion table that is to be added to each of the basic code conversion table in FIG. 25 in which the maximum number of minimum runs in sequence is limited to five; and FIG. 35 explains the number of code states at the time of coding, code word constraint length at the time of decoding and error propagation length at the time of decoding in the 7-state code conversion tables in FIGS. 20 to 22 and 8-state code conversion table in FIG. 33.

DETAILED DESCRIPTION OF THE PREFERRED EMBODIMENTS

The present invention will be described concerning the embodiments thereof with reference to the accompanying drawings.

Figure 1:
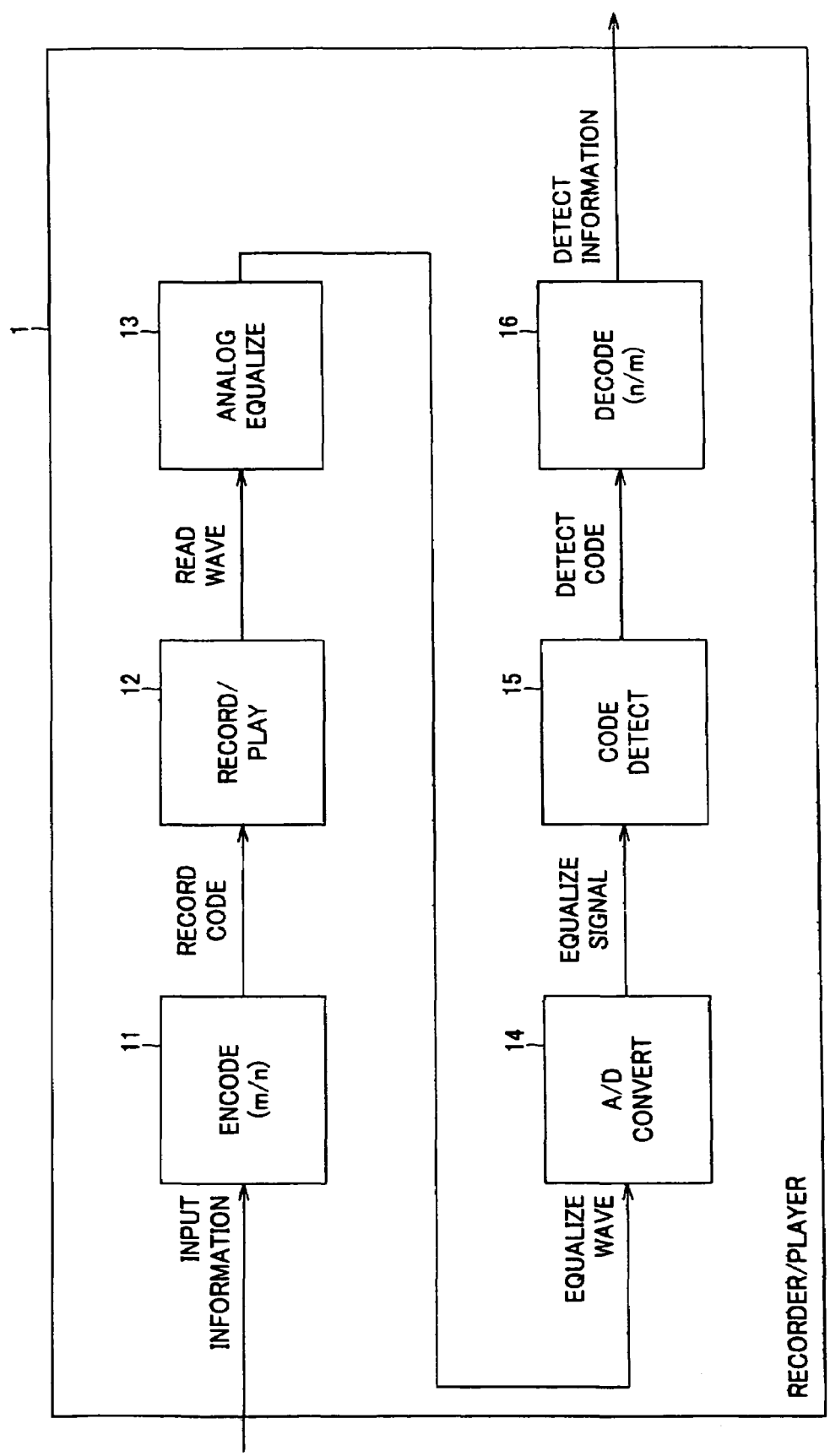
FIG. 1 is a block diagram of the conventional recorder/player.

Referring now to FIG. 1, there is schematically illustrated in the form of a block diagram a recorder/player 31 according to the present invention. It should be noted that the elements of this recorder/player 31, corresponding to those of the conventional recorder/player 1 shown in FIG. 1 are indicated with the same references as those used in FIG. 1 and will not be described below wherever appropriate. As will be seen, the recorder/player 31 shown in FIG. 11 is similar in construction to the recorder/player 1 in FIG. 1 except for a coding unit 51 provided in place of the encoder 11.

Figure 11:
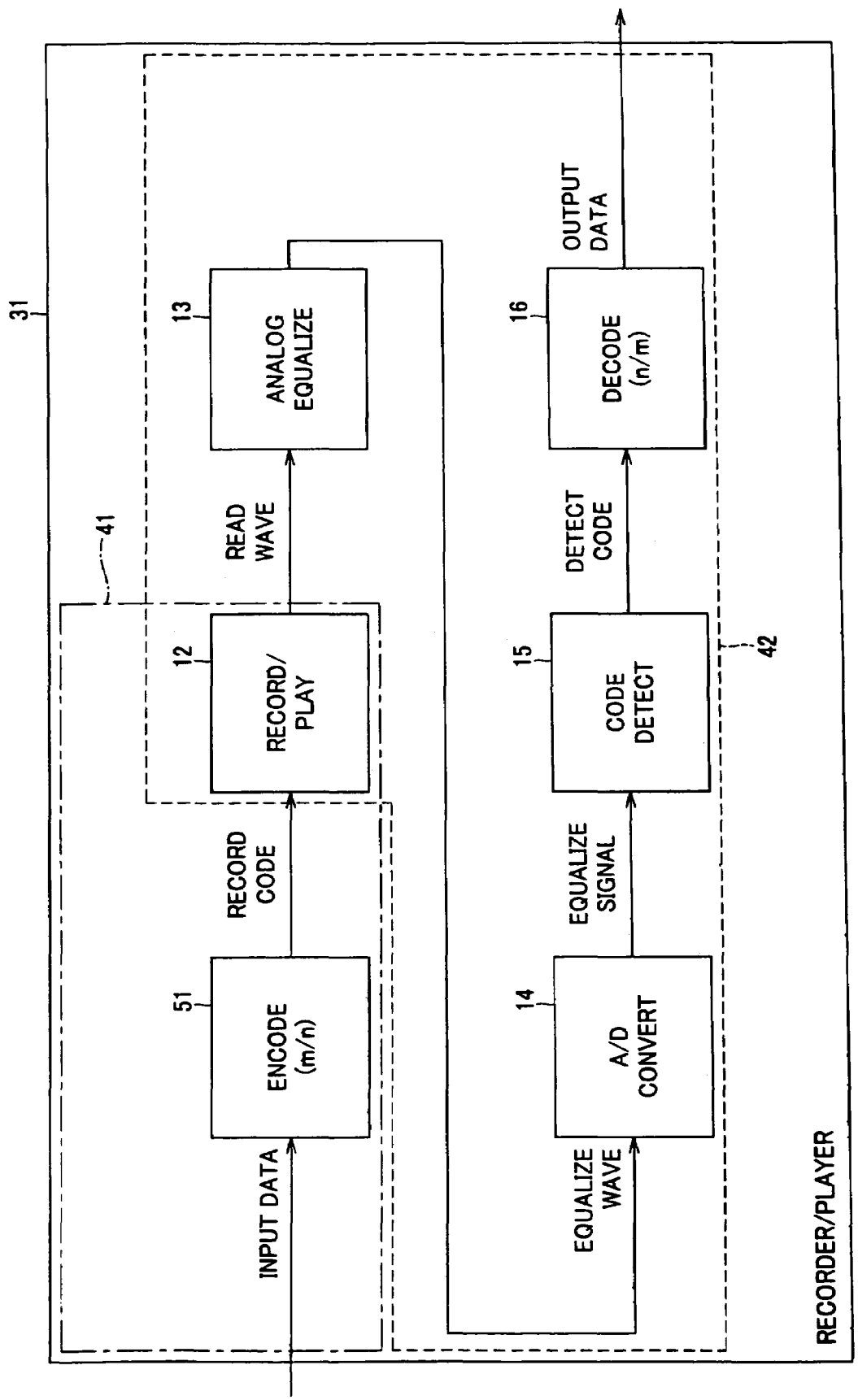
FIG. 11 is a block diagram of the recorder/player according to the present invention.

The recorder/player 31 shown in FIG. 11 may be composed of two units, namely, an encoder 41 composed of the coding unit 51 and a recording/playback unit 12, and a decoder 42 composed of the recording/playback unit 12 (also used in the encoder 41), an analog equalizer 13. A-D (analog-to-digital) converter 14, code detector 15 and a decoder 16. It should be noted that the decoder 42 may be designed to acquire a code sequence encoded by the encoder 41 and transmitted over a network (not shown) and decode the code sequence.

In the recorder/player 31 or decoder 42 shown in FIG. 11, a digital equalizer may additionally be provided between the A-D converter 14 and code detector 15 as in the conventional recorder/player 1 in FIG. 1 in case the code sequence cannot be equalized satisfactorily by the analog equalizer 13. It should be noted that in this case, a lowpass filler may be provided in place of the analog equalizer 13.

Figure 12:
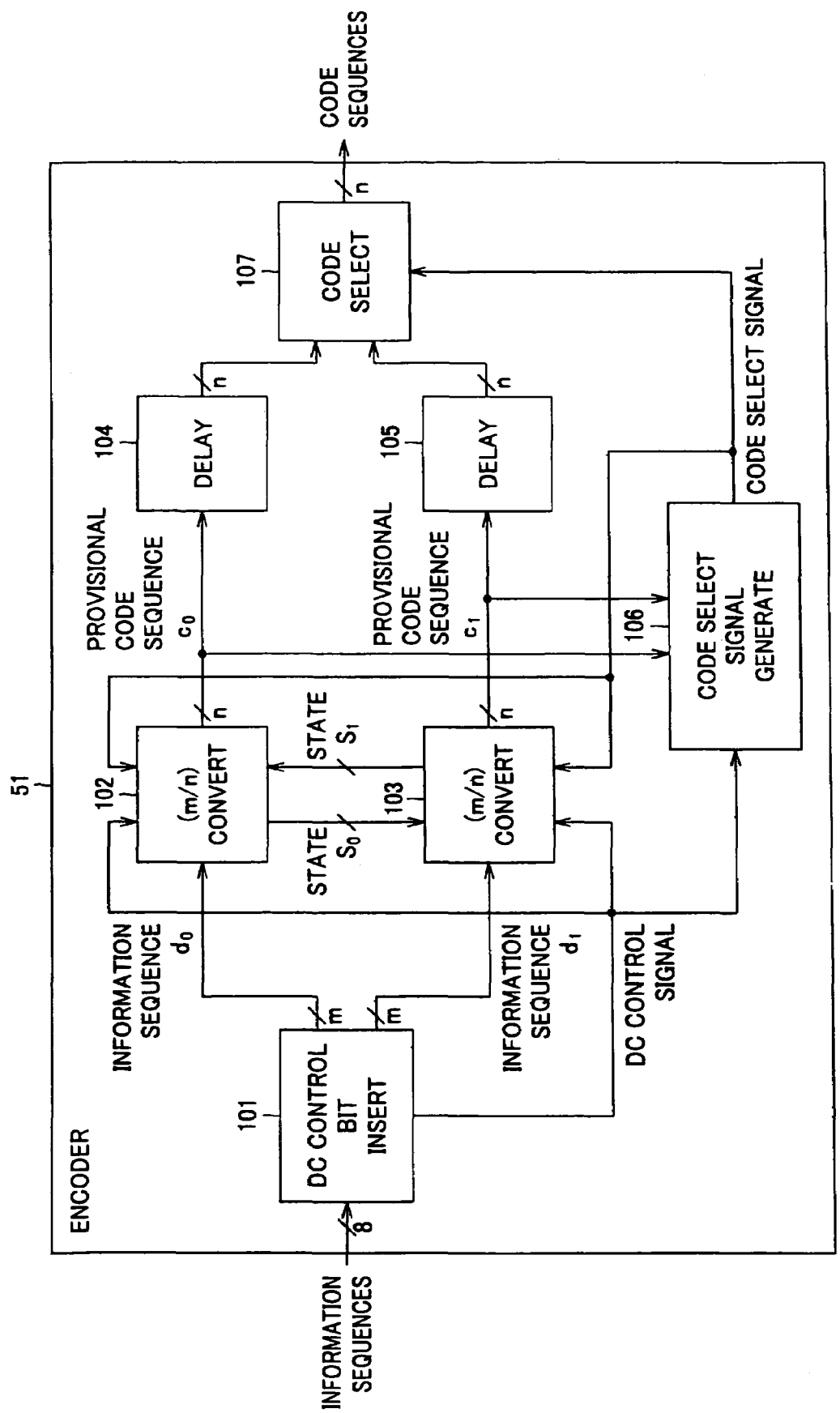
FIG. 12 is also a block diagram showing the construction of an encoder in FIG. 11.

The coding unit 51 in FIG. 11 makes a DC control of a code sequence via a coding of the code sequence by inserting DC control bits into an information sequence as will be described below:

FIG. 12 schematically shows, in the form of a block diagram, the construction of the coding unit 51 shown in FIG. 11 and which makes a DC control of a code sequence by inserting DC control bits into an information sequence as will be described herebelow.

The coding unit 51 includes a DC control bit inserting unit 101 that is continuously supplied with an information sequence in units of a byte (8 bits). The DC control bit inserting unit 101 generates an information sequence $d_0$ having provisional DC control bits 0 inserted therein at predetermined DC control intervals $T_{dc}$ and an information sequence $d_1$ having provisional DC control bits 1 inserted therein at the predetermined DC control intervals $T_{dc}$, and supplies the information sequence $d_0$ to an m-n converter 102 also included in the coding unit 51 and the information sequence $d_1$ to an m-n converter 103 also included in the coding unit 51.

In case the DC control bits are inserted into the information sequence supplied to the DC control bit inserting unit 101 at the intervals $T_{dc}$, the DC control bit inserting unit 101 provides an output sequence having a DC control redundancy of $1/(T_{dc}+1)$ in relation to the input sequence.

The DC control bit inserting unit 101 also supplies a DC control signal indicative of a DC control time to the m-n converter 102, m-n converter 103 and to a code select signal generator 106 also included in the coding unit 51.

The m-n converter 102 converts the supplied information sequence $d_0$ into a provisional code sequence $c_0$ at a conversion ratio of m to n, and supplies the provisional code sequence $c_0$ to a delay unit 104 also included in the coding unit 51 and to the code select signal generator 106 in units of n bits. Similarly, the m-n converter 103 converts the supplied information sequence $d_1$ into a provisional code sequence $c_1$ at the conversion ratio of m to n, and supplies the provisional code sequence $c_1$ to a delay unit 105 also included in the coding unit 51 and to the code select signal generator 106 in units of n bits.

The delay unit 104 delays the supplied provisional sequence $c_0$ by the DC control interval and supplies it to a code selector 107 also included in the coding unit 51. Similarly, the delay unit 105 delays the supplied provisional sequence $c_1$ by the DC control interval and supplies it to the code selector 107.

The code select signal generator 106 calculates RDS of each of the supplied provisional code sequences $c_0$ and $c_1$, then generates a code select signal indicative of which the code to be selected is, the provisional code sequence $c_0$ or $c_1$, to reduce the code sequence DSV as far as possible, and outputs it the m-n converts 102 and 103 and to the code selector 107 correspondingly to the supply timing of the DC control signal.

The code selector 107 is supplied with the delayed provisional code sequences $c_0$ and $c_1$, selects, based on the code select signal supplied from the code select signal generator 106, any one of the provisional code sequences that can have the DSV reduced as far as possible, and outputs it as a code sequence.

Note here that each of the m-n converters 102 and 103 incorporates an internal register for holding a code state at each time and copies, based on the supplied DC control signal and code select signal, the code state in the m-n converter 102 into the internal register of the m-n converter 103 when the provisional code sequence $c_0$ has been selected, and the code state in the m-n converter 103 into the internal register of the m-n converter 102 when the provisional code sequence $c_1$ has been selected.

The coding unit 51 make coding operations as will be described below with reference to the flow chart in FIG. 13. It should be assumed here that the coding unit 51 is capable of making a DC control of the code sequence by receiving an input information sequence of $N_i$ bytes and inserting DC control bits into the input information sequence at intervals of $T_{dc}$ bits.

In step S1, the DC control bit inserting unit 101 initializes variables i and j to zero (0), the m-n converter 102 assigns an initial state $s_1$ to the state $s_0$ of the internal register, and also the m-n converter 103 assigns the initial state $s_1$ to the state $s_0$ of the internal register. It should be noted here that the variable i indicates the number of processed bytes and variable j counts bits for inserting the DC control bits at correct intervals.

The DC control bit inserting unit 101 acquires 1-byte information sequence in step S2, and sets the variable i to i+1 and variable j to j+8 in step S3.

In step S4, the DC control bit inserting unit 101 judges whether the variable j satisfies a condition that $j<T_{dc}$.

In case it is determined in step S4 that the variable j does not the satisfy the condition that $j<T_{dc}$, the coding unit 51 goes to step S5 where the DC control bit inserting unit 101 will insert DC control bits 0 into the supplied information sequence to generate an information sequence $d_o$, and supply the information sequence $d_0$ to the m-n converter 102, while inserting DC control bits 1 into the supplied information sequence to generate an information sequence $d_1$ and supplying the information sequence $d_1$ to the m-n converter 103, and then set the variable j to $j-T_{dc}$.

If it is determined in step S4 that the variable j satisfies the condition that $j<T_{dc}$, the coding unit 51 goes to step S5. After completion of step S5, the coding unit 51 goes to step S6 where the m-n converters 102 and 103 will encode the information sequences $d_0$ and $d_1$ supplied to them, respectively, at a coding ratio of m/n to generate provisional code sequences $c_0$ and $c_1$, respectively. The m-n converter 102 outputs the provisional code sequence $c_0$ to the code select signal generator 106 and delay unit 104, while the m-n converter 103 outputs the provisional code sequence $c_1$ to the code select signal generator 106 and delay unit 105.

In step S7, the code select signal generator 106 calculates DSV of each of the supplied provisional code sequences $c_0$ and $c_1$ to provide DSV0 for the provisional code sequence $c_0$ and DSV1 for the provisional code sequence $c_1$.

In step S8, the code select signal generator 106 compares the calculation results (DSV0 and DSV1) in step S7 to judge whether DSV0>DSV1.

In case it is determined in step S8 that DSV0 is not larger than DSV1, the code select signal generator 106 supplies the m-n converters 102 and 103 and code selector 107 with a code select signal for selection of the provisional code $c_0$ as an output code sequence. Thus, in step S9, the code selector 107 will take an output code sequence $c_2$ as $c_0$ and the m-n converter 103 will replace the state $s_1$ of the internal register thereof with the state $s_0$ of the internal register of the m-n converter 102.

In case it is determined in step S8 that DSV0>DSV1, the code select signal generator 106 supplies the m-n converters 102 and 103 and code selector 107 with a code select signal for selection of the provisional code $c_1$ as an output code sequence. Thus, in step S10, the code selector 107 will take an output code sequence $c_2$ as $c_1$ and the m-n converter 102 will replace the state $s_0$ of the internal register thereof with the state $s_1$ of the internal register of the m-n converter 103.

In step S11, the code selector 107 outputs the code sequence $c_2$.

In step S12, the DC control bit inserting unit 101 compares the variable i with a number $N_i$ of supplied bytes to judge whether the variable i satisfies a condition that $i<N_i$. If it is determined in step S12 that the variable i satisfies the condition that $i<N_i$, the coding unit 51 returns to step S2 where it will repeat the operations in step S2 and subsequent steps. In case it is determined in step S12 that the variable i does not satisfy the condition that $i<N_i$, the coding unit 51 exits the coding procedure.

With the above operations, there are generated the encoded provisional code sequence $c_0$ having provisional DC control bits 0 inserted therein at an interval of $T_{dc}$ bits and the encoded provisional code sequence $c_1$ having a provisional DC control bit 1 inserted therein at the interval of $T_{dc}$ bits, and any of the provisional code sequences is selected based on the result of DSV calculation, and provided as the code sequence $c_2$. Thus, the code sequence can undergo the DC control.

Figure 13:
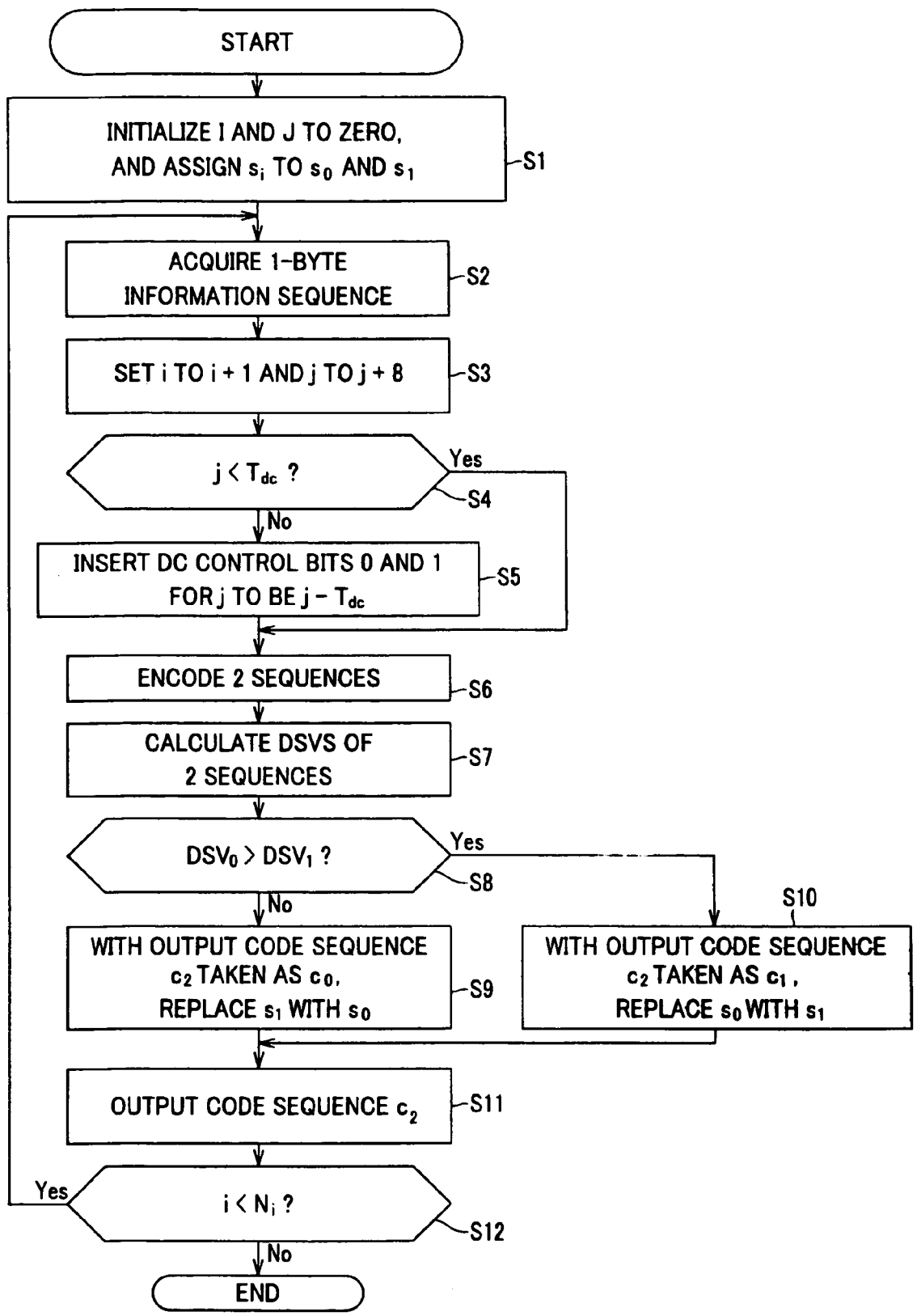
FIG. 13 shows a flow of operations made during coding in the encoder in FIG. 12.

As aforementioned, only the look-ahead code conversion table using the PP code word assignment is known as the code conversion table used in the coding procedure in step S6 in FIG. 13, and it can only be designed by a heuristic approach. If a code word assignment method having the same effect at the PP code word assignment method is available for use in the finite-state code conversion table, however, it is possible to design a theoretic conversion table using the ACH algorithm and there can thus be provided codes more excellent than the conventional ones.

Next, there will be explained a characteristic required for a code conversion table permitting an efficient DC control of a code sequence in case an information sequence is encoded according to a coding rule of the finite-state code conversion table by inserting DC control bits into the information sequence at predetermined bit intervals as in the coding unit 51 having been described above with reference to FIG. 12.

As having been described with reference to FIGS. 12 and 13, in case an information sequence having a provisional DC control bit 0 inserted in a specific position such as the top thereof is taken as an information sequence $d_0$ and an information sequence having a provisional DC control bit 1 inserted at the top thereof is taken as an information sequence $d_1$, for example, provisional code sequences resulted from encoding of the two information sequences $d_0$ and $d_1$ starting with the same state under the coding rule of the finite-state code conversion table are provisional code sequences $c_0$ and $c_1$, respectively. In this case, the code states at the time of the coding, stored in the internal registers of the m-n converters 102 and 103, respectively, are states $s_0$ and $s_1$, respectively.

For example, in case coding is done according to the code conversion table having been explained with reference to FIG. 6, when 7 bits "1, 1, 0, 0, 0, 1, 0" is supplied as an information sequence, the information sequences $d_0$ and $d_1$ having the provisional DC control bits inserted at the tops thereof, respectively, provisional code sequences $c_0$ and $c_1$ resulted from coding of these information sequences $d_0$ and $d_1$ starting with a state 2 according to the code conversion table in FIG. 6, and code states $s_0$ and $s_1$ at the time of coding will be $d_0$: 01, 10, 00, 10, $c_0$: 100, 101, 000, 010 and $s_0$: 2, 3, 1, 3, and $d_1$: 11, 10, 00, 10, $c_1$: 101, 010, 000, 010 and $s_1$: 4, 3, 1, 3, as shown in FIG. 14.

In the coding shown in FIG. 14, the states $s_0$ and $s_1$ of the provisional code sequences differ from each other since the corresponding input information words are different by 1 bit from each other even if the provisional code sequences are identical in initial state to each other. Thus, the state $s_0=2$ while the state $s_1=4$. Thereafter, however, the states will be $s_0=s_1=3$ in the second block. Once the states $s_0$ and $s_1$ are thus identical to each other, the provisional code sequences in the third and subsequent blocks will be identical to each other and the states thereof be identical to each other.

As above, the provisional code sequence $c_0$ resulted from coding of information sequence $d_0$ resulted from insertion of a provisional DC control bit 0 into an arbitrary information sequence, and the provisional code sequence $c_1$ resulted from coding of the information sequence $d_1$ resulted from insertion of a provisional DC control bit 1 into the arbitrary information sequence, will initially identical to each other and the initial states $s_0$ and $s_1$ thereof initially be identical to each other but will differ from each other once in many cases since the first input information words (that is, the provisional DC control bits) having been inserted into the original arbitrary information sequence are different by 1 bit from each other. Once the states $s_0$ and $s_1$ are made identical to each other by any subsequent conversion, however, the two provisional code sequences and their states will be identical to each other whatever the subsequent information sequence is.

Therefore, if the polarities of the provisional code sequences $c_0$ and $c_1$ after subjected to the NRZI modulation have been inverted when the states $s_0$ and $s_1$ become identical to each other, the RDS polarities of the subsequent provisional code sequences $c_0$ and $c_1$ will be inverted without fail. Thus, by selecting either of the provisional code sequences $c_0$ and $c_1$ as a fine code sequence so that the code sequences will have a DSV as small as possible, it is possible to attain an efficient DC control of the code•sequences.

To invert the polarities of the provisional code sequences $c_0$ and $c_1$ after subjected to the NRZI modulation when the states $s_0$ and $s_1$ of the provisional code sequences $c_0$ and $c_1$ become identical to each other, the parity $q_0$ as the two's complement of a sum of the provisional code sequences $c_0$ and the parity $q_1$ as the two's complement of a sum of the provisional code sequences $c_1$, after the code sequences become identical in state to each other, should be different in value from each other.

More specifically, for efficient DC control of code sequences by inserting DC control bits into an information sequence at constant intervals in encoding the information sequence according to the finite-state code conversion table, the following expression (2) should always be met by the parity $q_0$ of the provisional code sequence $c_0$ resulted from a provisional encoding, starting with an arbitrary start-point state, of an information sequence having a first insertion bit inserted therein and the parity $q_1$ of the provisional code sequence $c_1$ resulted from encoding, starting with the same start-point state, of the information sequence having a second insertion bit inserted therein when the states $s_0$ and $s_1$ become identical to each other:

$$q0 \ne q1 \quad (2)$$

After the states $s_0$ and $s_1$ becomes identical to each other, the provisional code sequences $c_0$ and $c_1$ are identical to each other. So, if the expression (2) holds when the states $s_0$ and $s_1$ become identical to each other, the parities $q_0$ and $q_1$ of the provisional code sequences after the states $s_0$ and $s_1$ become identical to each other meet condition given by the expression (2).

In the coding shown in FIG. 14, the two's complement $q_0$ of the sum of the code sequences $c_0$ "1, 0, 0, 1, 0, 1" up to the second block in which the states $s_0$ and $s_1$ become identical to each other is 1 and also the two's complement $q_1$ of the sum of the code sequences $c_1$ "1, 0, 1, 0, 1, 0" up to the second block is 1. In this case, the expression (2) does not hold. That is, in case the DC control bit is inserted at the first bit of the information word, the expression (2) will not hold for any arbitrary information sequence as will be known from the code conversion table in FIG. 6.

Also, it will be known from the code conversion table in FIG. 6, the expression (2) will not hold for any information sequence even in case the DC control bit is inserted at the second bit of the information word.

It is explained here that the expression (2) does not hold for a single information sequence. However, if the expression (2) holds for an information sequence, it is necessary to check if the expression (2) holds for other arbitrary information sequences.

More particularly, there are determined two's complements $q_0$ and $q_1$ of sums of provisional code sequences $c_0$ and $c_1$, respectively, resulted from encoding, starting with a fixed start-point state, of an information sequence $d_0$ having a block length L in which the bit in a specific position (top bit, for example) is 0 and an information sequence $d_1$ having the block length L in which the bit in the specific position is 1, respectively, until the states of the provisional code sequences become identical to each other for the first time.

Then, it is checked concerning all possible information sequences having the block length L and all standpoint states whether the two's complements $q_0$ and $q_1$ are different from each other.

However, in case the states become identical to each other in a block shorter than the length L, the information sequences are identical to each other until the states are identical to each other. In this case, it is not necessary to check whether the expression (2) holds for any information sequences having a block length smaller than the length L. Since the information sequence has an arbitrary length, it is impossible to make infinite the block length L in which the information sequences are to be checked. Thus, the length L should be a finite one. Further, if the states does not become identical to each other within the block length L in which the information sequences are to be checked, the information sequences should be disregarded.

Note here that it will be described later with reference to FIG. 18 whether the expression (2) holds also for an arbitrary information sequence having an infinite block length in a code conversion table if the expression (2) holds for an arbitrary information sequence having a finite block length L in the code conversion table.

It was verified whether there existed a code word assignment meeting condition given by the expression (2) for an arbitrary information sequence in case the code word assignment to each information word was changed in the 4-state code conversion table in FIG. 6, for example. The result of verification showed that when the length L of an information sequence including DC control bits is more than 4 blocks, none of (4!)4=331,776 code word assignments met condition given by the expression (2) for any arbitrary information sequence in the 4-state code conversion table in FIG. 6 whether the DC control bit was inserted at the first or second bit.

Similarly, it was verified whether there existed a code word assignment meeting condition given by the expression (2) for an arbitrary information sequence in case the code word assignment to each information word was changed in the 5-state code conversion table in FIG. 4, for example. The result of verification showed that when the length L of an information sequence including DC control bits is more than 5 blocks, none of (4!)5=7,962,624 code word assignments met condition given by the expression (2) for any arbitrary information sequence in the 5-state code conversion table in FIG. 4 whether the DC control bit was inserted at the first or second bit.

As above, in the conventional 4- or 5-state finite state (1, 7) RLL code conversion table, there existed no code word assignment that met condition given by the expression (2) for any arbitrary information sequence even when the code word assignment was altered.

On the other hand, condition given by the expression (2) was satisfied for an arbitrary information sequence in a 104-state finite state code conversion table resulted from re-assignment of a 3 bit code word to a 2-bit information word in each of the look-ahead code conversion tables in FIGS. 7 and 8 by delaying the 3-bit code word by 3 blocks and a 1691-state finite state code conversion table resulted from re-assignment of a 3-bit code word to a 2-bit information word in each of the look-ahead code conversion tables in FIGS. 7, 8 and 9 by delaying the 3-bit code word by 5 blocks. However, making the number of states smaller than that of codes subjected to the PP code word assignment is extremely difficult unless a finite-state code conversion table whose number of states is as small as possible is designed and then a code word assignment meeting condition given by the expression (2) for an arbitrary information sequence.

On this account, the present invention proposes to provide a code word assignment meeting condition given by the expression (2) for an arbitrary information sequence in a finite-state code conversion table whose number of states is relatively small by designing a new finite-state table using the ACH algorithm based on an approximate characteristic vector" different from the conventional approximate characteristic vector.

Figure 5:
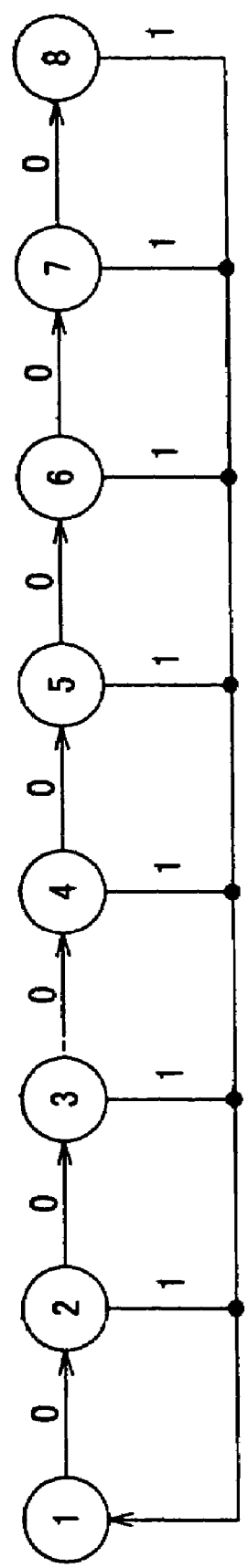
FIG. 5 is the 8-state transition diagram which provides the (1, 7) RLL code.

More specifically, an approximate characteristic vector "4, 6, 6, 6, 4, 4, 4, 2" was derived as an 8-dimensional approximate characteristic vector that can be determined from the finite-state transition diagram in FIG. 5. The conventional approximate characteristic vector as the ACH algorithm is "2, 3, 3, 3, 2, 2, 2, 1". As will be known, each element of this new approximate characteristic vector is a double of each element of the conventional approximate characteristic vector. A 7-state finite state table was newly determined using the ACH algorithm on the basis of the new approximate characteristic vector.

FIG. 15 shows a 7-state finite state table for the (1,7) RLL limitation, determined using the ACH algorithm on the basis of the approximate characteristic vector "4, 6, 6, 6, 4, 4, 4, 2". In the 7-state finite state table in FIG. 15, no code word assignment has yet been done to an information word. To provide a code conversion table on the basis of the finite state table in FIG. 15, a 3-bit code word of each state has to be assigned to a 2-bit information word in 4 kinds: 00, 01, 10 and 11. Such an code word assignment in the finite state table in FIG. 15 is in (4!)7=4,586,471,424 kinds.

Next, there will be described how to judge whether a code word assignment meeting condition given by the expression (2) for an arbitrary information sequence exists in the finite state table in FIG. 15 when a code word assignment has been done to an information word.

Figure 16:
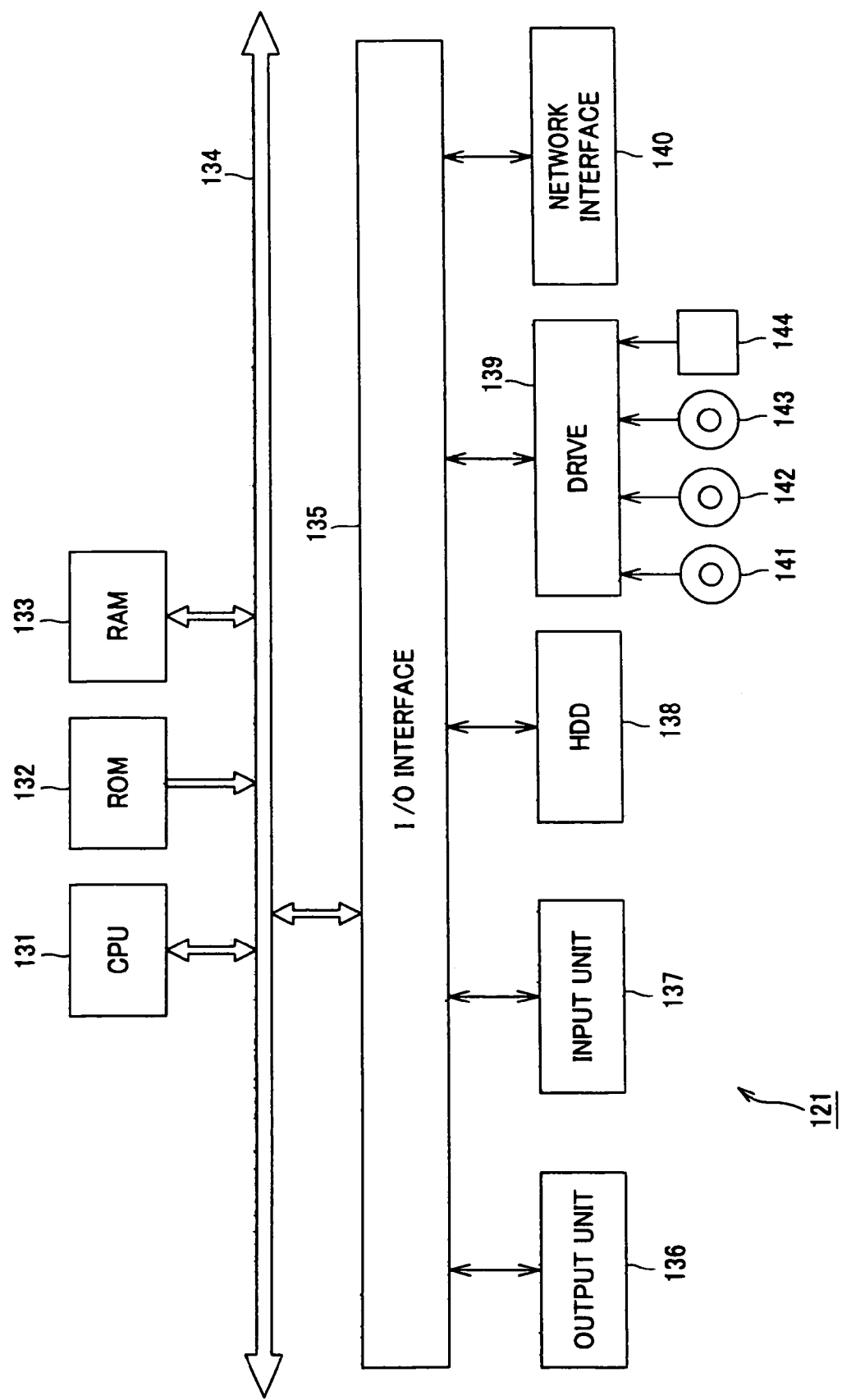
FIG. 16 is a block diagram of a personal computer.

A finite state table can be searched by a personal computer as shown in FIG. 16 or the like, not depending upon any block length L to be checked, for a code word assignment meeting condition given by the expression (2) for an arbitrary information sequence.

FIG. 16 shown an example of the construction of a personal computer. As shown, the personal computer, generally indicated with a reference 121, includes a CPU (central processing unit) 131 that makes various operations according a program stored in a ROM (read-only memory) 132 or a program loaded to a RAM (random-access memory) 133 from a hard disk (HDD) 138. The RAM 133 appropriately stores necessary data for the CPU 131 to execute various operations.

The CPU 131. ROM 132 and RAM 133 are connected to each other via an internal bus 134. The internal bus 134 has also an input/output interface 135 connected thereto.

The input/output interface 135 has connected thereto an input unit 137 consisting of a keyboard, mouse and the like, and output unit 136 consisting of a display such as a CRT (cathode ray tube), LCD (liquid crystal display), or the like and that displays an image and text and a speaker that outputs a sound, an HDD 138 that records and reproduces information, and a network interface 140 consisting of a modem, terminal adapter and the like. The network interface 140 makes communications via a network such as Internet, for example.

The input/output interface 135 has also a drive 139 connected thereto as necessary. The drive 139 has connected thereto a magnetic disk drive 141, optical disk drive 142, magneto-optical disk drive 143, semiconductor memory 144 or the like appropriately, and a computer program read from any of these units is installed into the HDD 138 as necessary.

As will be described below with reference to the flow chart in FIG. 17, a finite state table is searched by the personal computer 121 as shown in FIG. 16 or the like, not depending upon any block length L to be checked, for a code word assignment meeting condition given by the expression (2) for an arbitrary information sequence.

In step S31, based on a user's command supplied from the input unit 137 or information pre-stored in the HDD 138, the CPU 131 acquires a finite state table to be checked using the ACH algorithm, for example. For example, the CPU 131 determines the 8-dimensional approximate character vector "4, 6, 6, 6, 4, 4, 4, 2" from the finite-state transition diagram in FIG. 5, and the 7-state finite table shown in FIG. 15 and that provides a (1, 7) RLL limitation using the ACH algorithm.

In step S32, the CPU 131 reads variables L and $N_0$ provisionally stored in the RAM 133, initializes them by assigning zeros (0) to them, and then stores the initialized variables into the RAM 133 again. It should be noted here that the variable L is a block length to be checked and variable $N_0$ is a number of code word assignments meeting condition given by the expression (2) for an arbitrary information sequence having the variable L that indicates the block length.

In step S33, the CPU 131 increments the value of the variable L provisionally stored in the RAM 133 by one (1) to set L to L+1, sets a variable M to 0, assigns $N_0$ to an variable $N_1$ to set $N_1$ to $N_0$, then assigns zero (0) to $N_0$, and stores the variables into the RAM 133 again. It should be noted here that the variable $N_1$ is the value of the previously calculated $N_0$ and the variable M is a number of code word assignments.

In step S34, the CPU 131 increments the variable M provisionally stored in the RAM 133 to set the variable M to M+1, stores the variable M into the RAM 133 again. Namely, it changes or updates the code word assignment. For example, in case the finite state table in FIG. 15 is acquired in step S31, 3-bit code word is assigned to four kinds of 2-bit information word, namely, the code word assignment is changed or updated, in step S34, to a new code word assignment having not ever been searched for. However, the first code word assignment to search for may be an arbitrary one but the second or subsequent code word assignments to search for should be new ones having not ever been searched for.

In step S35, the CPU 131 judges whether there exists any one information sequence whose block length is L, in which condition given by the expression (2) is not met, namely, $q_0=q_1$, when the states $s_0$ and $s_1$ in the provisional code sequences $c_0$ and $c_1$ coincide with each other as having been described above with reference to FIGS. 12 to 14. In case it is determined in step S35 that there exists no information sequence whose block length is L, in which $q_0=q_1$, the CPU 131 goes to step S36. If it is determined in step S35 that there exists an information sequence whose block length is L, in which $q_0=q_1$, the CPU 131 goes to step S37.

However, in case it is determined in step S35 that there is no information sequence for which two provisional code sequences coincide in state with each other, the CPU 131 may go to step S36 or S37. It is assumed herein that the CPU 131 will go to step S37. In this case, however, the CPU 131 operates on the assumption that in at least one of all the code word assignments having been searched for, there exists at least one information sequence for which two code sequences coincide in state with each other.

In case it is determined in step S35 that there exists no information sequence whose block length is L, in which $q_0=q_1$, the CPU 131 goes to step S36 where it will increment the value of the variable $N_0$ by one (1) to set $N_0$ to $N_0+1$ while storing a code conversion table using the code word assignment in consideration or necessary and sufficient information for representation of a code conversion table using that code word assignment into the RAM 133.

In step S37, the CPU 131 reads and compares the variable M and total number $M_p$ of code word assignments provisionally stored in the RAM 133 to judge whether $M<M_p$. The total number $M_p$ of code word assignments is $(4!)7=4,586,471,424$ in the case of the finite state table having been described with reference to FIG. 15, for example. If it is determined in step S37 that M is smaller than $M_p$, the CPU 131 returns to step S34 where it will repeat the above operations.

If it is determined in step S37 that M is not smaller than $M_p$, the CPU 131 goes to step S38 where it will read the variables $N_1$ and $N_0$ provisionally stored in the RAM 133 and judge whether $N_0 \neq N_1$ and $N_0 \neq 0$. If it is determined in step S38 that $N_0 \neq N_1$ and $N_0 \neq 0$, the CPU 131 returns to step S33 where it will repeat the above operations. In case it is determined in step S38 that the conditions $N_0 \neq N_1$ and $N_0 \neq 0$ are not met, the CPU 131 exists the code conversion table searching procedure.

Figure 17:
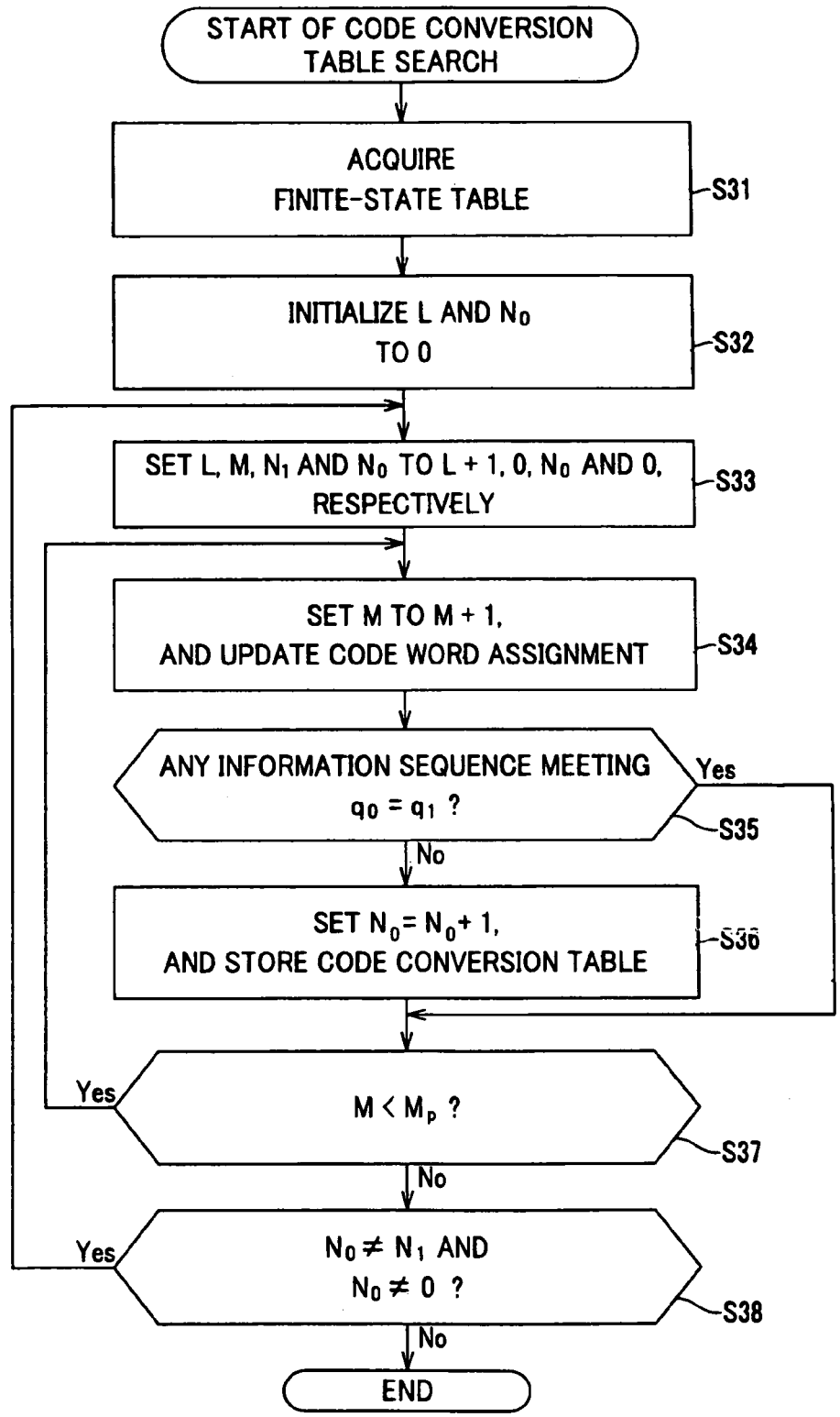
FIG. 17 shows a flow of operations made in detection of a code conversion table.

The code conversion table stored after the last L-dependent search through the code conversion table searching procedure having been described with respect to FIG. 17 includes all code word assignments meeting condition given by the expression (2) for an arbitrary information sequence, not dependent upon the block length L to be checked, and the variable $N_0$ indicates the number of such code word assignments. That is, when $N_0=0$, there exists no code word assignment meeting condition given by the expression (2) for an arbitrary information sequence in the finite state table.

Next, a number N(L) of code word assignments meeting condition given by the expression (2) for an arbitrary information sequence was determined as in the flow chart in FIG. 17 in case the block length L of an information sequence including DC control bits is changed for all the $(4!)7=4,586,471,424$ code word assignments in the 7-state finite table in FIG. 15.

However, since the finite state table in FIG. 15 is prepared using the ACH algorithm, a code resulted from a coding according to the finite state table having subjected to any code word assignment in the finite state table in FIG. 15 can be decoded by the "sliding block", but the code word constraint lengths at the time of decoding include a 4-block one and a 3-block one. The code word assignments for the code word constraint length at the time of decoding to be 3 blocks count 382,205,952 which is equivalent to 1/12 of the total number.

FIG. 18 shows acceptable numbers N(L) of code word assignments meeting condition given by the expression (2) for an arbitrary information sequence whose block length is L when the block length L to be checked is changed in the finite state table in FIG. 15. There are shown the numbers of code word assignments which are when the code word constraint lengths are 4 blocks and 3 blocks, respectively, at the time of decoding. Also, whether a DC control bit is inserted fixedly at the first bit or second bit of an information word, calculation results in the same number N(L) of code word assignments meeting condition given by the expression (2).

More specifically, in the case of the constraint length 4, 955,514,880 code word assignments meet condition given by the expression (2) when the block length L is one. As the number of blocks increases, the number N(L) of word code word assignments meeting condition given by the expression (2) decreases. When the block length L is six, such code word assignments count 327.680. Even when the block length L is seven, the number N(L) of code word assignments is 327,680 which is the same as when the block length L is six.

On the other hand, in the case of the constraint length 3, 63,700,992 code word assignments meet condition given by the expression (2) when the block length L is one, and 68,950,144 code word assignments meet that expression (2) when the block length L is two. As the number of blocks increases, the number N(L) of the code word assignments meeting condition given by the expression (2) decreases and counts 65,536 when the block length L is six. Even when the block length L is seven, the number N(L) of code word assignments meeting condition given by the expression (2) is 65,536 which is the same as when the block length L is six.

That is, as shown in FIG. 18, the number N(L) of code word assignments meeting condition given by the expression (2) increases as the block length L, which is less than six, increases except that the block length L increases from one to two in the case of the constraint length 3, but it does not increase when the block length L increases from six to seven.

Also, all the 393,216 code word assignments (with the constraint lengths 4 and 3) meeting condition given by the expression (2) for an arbitrary information sequence whose block length L is six meet that expression (2) (given by the expression (2)) for arbitrary information sequences even when the block length L is increased to seven or eight. Further, some extracted at random from the 393,216 code word assignments were found to meet condition given by the expression (2) for an arbitrary information sequence even when the block length L was increased to twelve, for example.

The reason for the above is that when the block length L is increased to some extent, two provisional code sequences which do not coincide in code state with each other will repeat themselves. Therefore, even of the block length L is infinitely great (which however is actually impossible), the above 393,216 code word assignments will meet condition given by the expression (2).

That is, a number N(L) of the code word assignments, found when the following expression (3) holds as a result of calculating a number N(L) of code word assignments meeting condition given by the expression (2) as the block length L to be checked is changed, is a number of code word assignments not dependent upon the block length L to be checked but meeting condition given by the expression (2) for an arbitrary information sequence.

$$N(L)=N(L-1) \qquad (3)$$

As seen in FIG. 18, when the code word constraint length is 3 blocks at the time of decoding, the number N(L) of code word assignments is smaller with the block length L of two than with the block length L of one. The reason lies in that when an input information sequence is extremely short, there will occur a code word assignment with zero event that the state $s_0$ of the provisional code sequence $c_0$ coincides with the state $s_1$ of the provisional code sequence $c_1$ and it is regarded that the expression (2) will not hold for such a code word assignment.

As having been explained above with reference to FIG. 18, in case a DC control bit is inserted fixedly at either the first or second bit of an information word in the finite state table in FIG. 15, a total of 393,216 code word assignments meeting condition given by the expression (2) exist for an arbitrary information sequence, not depending upon any block length to be checked. As mentioned above, however, the number of code word assignments meeting condition given by the expression (2) for an arbitrary information sequence is fixed whether a DC control bit is inserted fixedly at any of the first and second bits of an information word, but all the code word assignments will not be identical to each other.

Whether the DC control bit is inserted at any of the first and second bits of an information word, condition given by the expression (2) is met for an arbitrary information sequence by 196,608 code word assignments, which is just a half of the aforementioned count "393,216".

Therefore, when a DC control bit is inserted at either the first or second bit of an information word, condition given by the expression (2) is met for an arbitrary information sequence by 3×196,608=589,824 code word assignments. This number of code word assignments is a total number of the code word assignments, in the finite state table in FIG. 15, that meet condition given by the expression (2), not depending upon any block length to be checked. That number of code word assignments is 1/7776 of all the possible code word assignments in the finite state table in FIG. 15.

The 589,824 code word assignments in the finite state table in FIG. 15 and meeting condition given by the expression (2), not depending upon any block length, are sorted into three types according to the inserted position of a DC control bit when condition given by the expression (2) is met for an arbitrary information sequence. The three types include a type 1 indicating a "code word assignment meeting condition given by the expression (2) for an arbitrary information only when a DC control bit is inserted at the first bit of an information word", a type 2 indicating a "code word assignment meeting condition given by the expression (2) for an arbitrary information sequence only when a DC control bit is inserted at the second bit of an information word", and a type 3 indicating a "code word assignment meet condition given by the expression (2) for an arbitrary information sequence whether a DC control bit is inserted at any of the first and second bits of an arbitrary information sequence".

FIG. 19 shows numbers of code word assignments of the types 1 to 3 each with the code word constraint length of 3 blocks and 4 block, respectively. As shown in FIG. 19, the number of code word assignments with the constraint length of 4 blocks is 5 times of that with the constraint length of 3 blocks, and the code word assignments of the types 1 to 3 are identical in number to each other.

Next, three code conversion tables for relative similar code word assignments resulted from an actual code word assignment in the finite state table in FIG. 15 will be described with reference to FIGS. 20 to 22.

The code conversion table in FIG. 20 is a first example of the finite state-type 7-state code conversion table of the (1, 7) RLL code.

The code word assignment in the code conversion table in FIG. 20 meets condition given by the expression (2) for an arbitrary information when the code word constraint at the time of decoding is 3 blocks and whether a DC control bit is inserted at the first or second bit of an information word. This code word assignment is one of the 32,768 code word assignments of the type 3 shown in FIG. 19.

The code conversion table in FIG. 21 is a second example of the finite state-type 7-state code conversion table of the (1, 7) RLL code.

The code word assignment in the code conversion table in FIG. 21 meets condition given by the expression (2) for an arbitrary information when the code word constraint at the time of decoding is 3 blocks and whether a DC control bit is inserted at the first or second bit of an information word, as in the code conversion table in FIG. 20. This code word assignment is one of the 32,768 code word assignments of the type 3 shown in FIG. 19. The code conversion table in FIG. 21 is characterized differently from that in FIG. 20, which will be described in detail later.

The code conversion table in FIG. 22 is a third example of the finite state-type 7-state code conversion table of the (1, 7) RLL code.

The code word assignment in the code conversion table in FIG. 22 meets condition given by the expression (2) for an arbitrary information when the code word constraint at the time of decoding is 3 blocks and only when a DC control bit is inserted at the first bit of an information word. This code word assignment is one of the 32,768 code word assignments of the type 1 shown in FIG. 19. The code conversion table in FIG. 22 is characterized differently from those in FIGS. 20 and 21, which will be described in detail later.

When a 7-bit information sequence "1, 1, 0, 0, 0, 1, 0" is supplied, the code conversion table in FIG. 21 is updated to meet condition given by the expression (2) as will be described below with reference to FIG. 23.

When the 7-bit information sequence "1, 1, 0, 0, 0, 1, 0" is supplied, the information sequences $d_0$ and $d_1$ having the provisional DC control bits inserted at the tops thereof, respectively, provisional code sequences $c_0$ and $c_1$ resulted from coding of these information sequences $d_0$ and $d_1$ starting with the state 3 according to the code conversion table in FIG. 21, and code states $s_0$ and $s_1$ at the time of coding will be $d_0$: 01, 10, 00, 10, $c_0$: 000, 100, 001, 001 and $s_0$: 1, 6, 6, 3 and $d_1$: 1, 10, 00, 10, $c_1$: 000, 010, 101, 001 and $s_1$: 4, 7, 6, 3, as shown in FIG. 23.

In this example, the states $s_0$ and $s_1$ of the provisional code sequences $c_0$ and $c_1$, respectively, are $s_0=s_1=6$ at a third block, namely, they are identical to each other. The two's complement $q_0$ of a sum of the code sequences $c_0$="0, 0, 0, 1, 0, 0, 0, 1" up to a time when the code states become identical to each other is zero (0), while the two's complement $q_1$ of a sum of the code sequences $c_1$="0, 0, 0, 0, 1, 0, 1, 0, 1" up to a time when the code states become identical to each other is one (1). Therefore, the expression (2) holds in this case.

Also in the coding according to the code conversion table in FIG. 21, the expression (2) also holds even when the aforementioned two provisional code sequences coincide in state with each other in case an information sequence having bits different from the 7 bits "1, 1, 0, 0, 0, 1, 0" or in case a DC control bit is inserted at the second bit of an information word.

The finite-state code conversion tables in FIGS. 20 to 22 have their own different characteristics. However, the differences among these tables in FIGS. 20 to 22 will not be easy to understand.

Next, there will be discussed conversion of the finite-state code conversion tables in FIGS. 20 to 22 into look-ahead code conversion tables, characteristics of the look-ahead code conversion tables and differences among these look-ahead code conversion tables.

Conventionally, a look-ahead code conversion table is converted to a finite-state one as aforementioned, but there is no case that a finite-state code conversion table is converted into a look-ahead one. To convert a finite-state code conversion table into a look-ahead code conversion table, a code word advanced a necessary look-ahead amount for coding should be re-assigned to an information word. However, if there is given only a finite-state code conversion table, it is not always easy to know the necessary amount of advance for look-ahead. Thus, conversion of a finite-state code conversion table into a look-ahead one is more difficult than conversion of a look-ahead code conversion table into a finite-state one.

For example, in case a finite-state code conversion table is designed using the ACH algorithm, it is well known that the maximum amount of look-ahead advance is a maximum value of each element in an approximate character vector used minus one (1). However, since the value is the maximum amount of look-ahead advance, it does not always coincide with a minimum necessary amount of look-ahead.

Note here that when the necessary amount of look-ahead advance for decoding of a variable-length code conventionally used for coding is $L_d$ blocks, the necessary amount of look-ahead advance for coding is $L_d/2$ when the amount $L_d$ is an even number, and $(L_d-1)/2$ when the amount $L_d$ is an odd number. A necessary amount of look-ahead advance for decoding can be known when checking the code word constraint length for decoding on the basis of a finite-state code conversion table.

In the case of a code resulted from coding by the code conversion tables in FIGS. 20 to 22, the code word constraint length at the time of decoding is 3 blocks including a current one. Since the necessary amount of look-ahead advance for decoding is 2 blocks, the necessary amount of look-ahead advance for coding can be estimated to be one block.

By re-assigning a code word advanced one block to an information word in the code conversion tables in FIGS. 20 to 22 on the basis of the above fact, the finite-state code conversion tables can be converted into look-ahead ones, respectively.

The re-assignment of the code word advanced one block to the information word is such that since in a state 4, an information word preceding the information word in consideration is always "11" as in FIG. 21 for example, a code word "010" created from the state 4 is assigned to the information word "11".

FIG. 24 shows a look-ahead code conversion table for the (1, 7) RLL code, resulted from conversion of the finite-state code conversion table in FIG. 20 by re-assigning a code word advanced one block to an information word.

FIG. 25 shows a look-ahead code conversion table for the (1, 7) RLL code, resulted from conversion of the finite-state code conversion table in FIG. 21 by re-assigning a code word advanced one block to an information word.

FIG. 26 shows a look-ahead code conversion table for the (1, 7) RLL code, resulted from conversion of the finite-state code conversion table in FIG. 22 by reassigning a code word advanced one block to an information word.

In the look-ahead code conversion tables in FIGS. 24 to 26, the first column shows supplied information bits and the second column show given codes. Also, in the tables, ("0") indicates that a preceding code bit is 0 and ("1") indicates that the preceding code bit is 1.

Next, the characteristics of the look-ahead code conversion tables in FIGS. 24 to 26 will be discussed.

The look-ahead code conversion table in FIG. 24 adopts a parity preserved (PP) code word assignment given by the expression (1) in which the information and code sequences always coincide in parity with each other. In comparison with the conventional codes shown in FIGS. 7 and 8, the (1,-7) RLL code shown in FIG. 24 is improved in that the number of states at the time of coding is decreased from 104 to 7, the code word constraint length at the time of decoding is decreased from 5 to 3 blocks and the error propagation length at the time of decoding is decreased from 10 to 6 bits. The code word assignments having similar characteristic to that of the code word assignments in the code conversion table in FIG. 24 count a half of the number of code word assignments of the type 3 in FIG. 19.

In the look-ahead code conversion table in FIG. 25, the code word assignment is done so that when the number of blocks is odd, an information sequence will differ in parity from a code sequence and when the number of blocks is even, the information sequence will coincide in parity with the code sequence. Apparently, the code word assignment is different from the PP code word assignment given by the expression (1).

In the look-ahead code conversion table, however, the code resulted from the code word assignment as in FIG. 25 can undergo the same DC control as the code resulted from the PP code word assignment having been described with reference to FIG. 24. The reason is that whether the number of blocks is odd or even when the code word assignment as in FIG. 25, the polarity inversion in a code sequence is assured during insertion of a DC control bit. The code word assignments similar in characteristic to those in the code conversion table in FIG. 25 count a half of the code word assignments of the type 3 shown in FIG. 19.

Apparently, the look-ahead code conversion table in FIG. 26 differs the PP code word assignment and also from the code word assignment in FIG. 25. In the code conversion table in FIG. 26, a code word assignment is done for an information sequence including an information word "01" or "11" in the odd-number block so that the information sequence will differ in parity from a code sequence and for an information sequence including the information word "01" or "11" in the even-number block so that the information sequence will coincide in parity with the code sequence.

It is different to apparently judge whether the DC control can be done efficiently using the code conversion table in FIG. 26. Also in the case of a code resulted from the code word assignment as in FIG. 26, however, a DC control equivalent to that of the code resulted from the code word assignment having been described with reference to FIGS. 24 and 25 can be done by inserting a DC control bit fixedly at the first bit of an information word.

As having been described in the foregoing, to meet the condition given by the expression (1), an information sequence has to coincide in parity with a code sequence in the look-ahead code conversion table. To meet the condition given by the expression (2) for the finite-state code conversion table, the parity of an information sequence may not always coincide with that of a code sequence but it suffices that two provisional code sequences should different in parity from each other. That is, the condition given by the expression (2) include that given by the expression (1).

The code word assignments in the finite-state code conversion table, searched as in the flow chart shown in FIG. 17, include many code word assignments meeting the condition given by the expression (1) as well as many ones different from the conventional PP code word assignment having been discussed with reference to FIGS. 25 and 26 when the finite-state code conversion table has been converted to a look-ahead one.

In the finite-state code conversion table, a code word assignment in which that the expression (2) never fails to hold when two provisional code sequences coincide in state with each other for an arbitrary information sequence will be called "parity-different code word assignment" and the method of such a code word assignment be called "parity-different code word assignment method" hereunder.

Next, there will be described with reference to FIGS. 27 and 28 the effect of code spectrum suppression in a low-frequency band when the encoder 51 having been described with reference to FIGS. 11 to 13 changes the DC control redundancy by encoding an information sequence according to each of the finite-state code conversion tables having been described with reference to FIGS. 4 and 6 and FIGS. 20 to 22.

More specifically, when a channel clock fc is taken as an index of the effect of suppressing the low-frequency spectrum of a code, a power spectral density fc/1024 is used as a typical value of the effect. Also, an operation for determine a spectrum component of fc/1024 by making a discrete Fourier transform of a code sequence of 4096 bits after NRZI-modulated was repeated 10,000 times for each of different random information sequences, and a mean square was measured.

Figure 27:
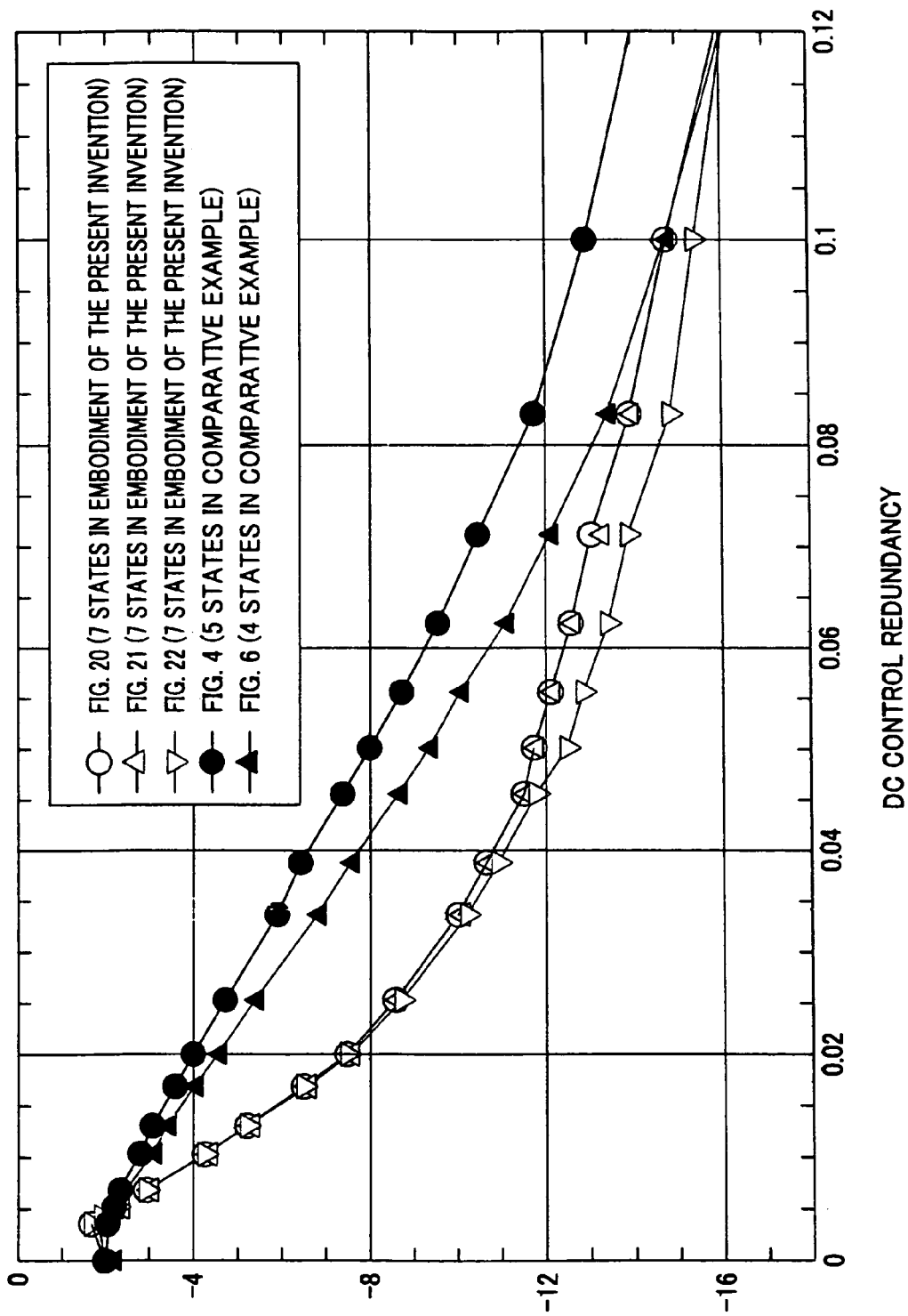
FIG. 27 explains the dependence of the power spectral density on the DC control redundancy.
Figure 28:
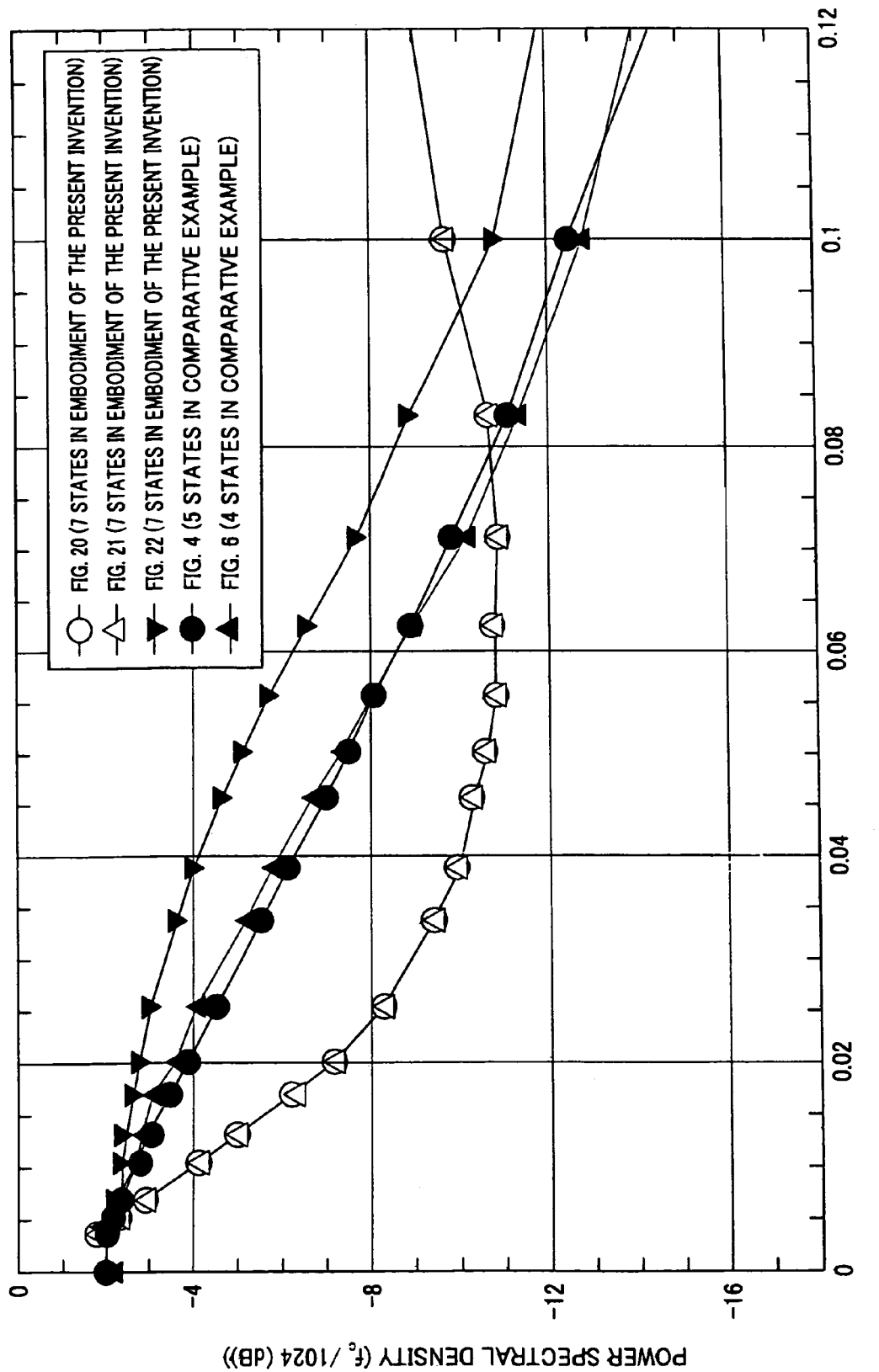
FIG. 28 explains the dependence of the power spectral density on the DC control redundancy.

FIG. 27 shows the dependence of the power spectral density of fc/1024 on the DC control redundancy when coding done according to the code conversion table having been described with reference to FIGS. 4 and 6 as well as to FIGS. 20 to 22 with a DC control bit being inserted at the first bit of an information word, and FIG. 28 shows the dependence of the power spectral density of fc/1024 on the DC control redundancy when coding done according to the code conversion table having been described with reference to FIGS. 4 and 6 as well as to FIGS. 20 to 22 with a DC control bit being inserted at the second bit of the information word.

In case the coding is done according to the code conversion tables in FIGS. 20 to 22 with the DC control bit being inserted at the first bit of the information word, the effect of suppressing the low-frequency spectrum in a wide range of the DC control redundancy from 0.007 to 0.12 as shown in FIG. 27 in comparison with that in a coding according to the conventional finite-state code conversion table.

In case the coding is done according to the code conversion tables in FIGS. 20 to 22 with the DC control bit being inserted at the second bit of the information word, the effect of suppressing the low-frequency spectrum in a wide range of the DC control redundancy from 0.007 to 0.08 as shown in FIG. 28 in comparison with that in coding according to the conventional finite-state code conversion table.

Also, when the coding is done according to the code conversion table in FIG. 22 with the DC control bit being inserted at the first bit of the information word, the low-frequency spectrum can be suppressed with a high effect as shown in FIGS. 27 and 28. However, when the coding is done with the DC control bit being inserted at the second bit, the effect of suppressing the low-frequency spectrum will be lower than in a coding according to the conventional 4- or 5-state code conversion table for the reason that the code word assignment is done to meet the condition given by the expression (2) for an arbitrary information sequence only when the coding is done according to the code conversion table in FIG. 22 with the DC control bit being inserted at the first bit of the information word with the DC control bit being inserted at the second bit of the information word.

Note however that by making a mutual replacement between a code word assigned to the information word "01" and a code word assigned to the information word "10" or between a code word assigned to the information word "00" and a code word assigned to the information word "11" in any of the code conversion tables, a code word assignment when the DC control bit is inserted at the first bit of the information word and a code word assignment when the DC control bit is inserted at the second bit have their natures thereof completed swapped between them.

That is, in the coding according to the present invention, it is not so important whether the DC control bit is inserted at the first bit of an information word or at the second bit. The DC control bit should be inserted at the first bit of an information word or at the second bit by selecting a code word assignment capable of a higher effect of suppressing the low-frequency band according to the inserted position of the DC control bit or according to a code word assignment used.

As will be known from FIG. 27, when coding is done according to the 7-state code conversion table in FIG. 21 for example, the redundancy of the DC control bit can considerably be improved from $1/22=0.04545$ to $1/40=0.025$ to have a power spectral density of fc/1024 at −8.5 dB, in comparison with that in coding according to the 4-state code conversion table in FIG. 6. Actually, however, the extent of suppressing the power spectral density of fc/1024 depends on a system used, but it is usually less than −6 dB. Also, the effect of suppressing the code spectrum in the low-frequency band depends on a DC control method used.

As above, in case DC control bits are inserted in an information sequence, a code sequence can DC-controlled efficiently by coding the information sequence according to the finite-state code conversion tables in FIGS. 20 to 22.

More specifically, in a first example of the coding rule used in the encoder 51 that converts an m-bit information word continuously into an n-bit code word after inserting DC control bits for DC control of a code sequence into an information sequence, when the coding rule is represented by a finite-state code conversion table, the information word is assigned to the code word in the code conversion table so that when the state $s_0$ of the provisional code sequence $c_0$ resulted from a coding starting with an arbitrary start-point state on the assumption that the DC control bit is 0 becomes the same as the state $s_1$ of the provisional code sequence $c_1$ resulted from a coding starting with the same start-point state as in the provisional code sequence $c_0$ on the assumption that the DC control bit is 1, the two's complement of a sum of the provisional code sequences $c_0$ will always differ from that of a sum of the provisional code sequences $c_1$.

Also, in a second example of the coding rule used in the encoder 51 that converts an m-bit information word continuously into an n-bit code word after inserting DC control bits for DC control of a code sequence into an information sequence, under the condition in the above first example and also when the coding rule is represented by a look-ahead code conversion table, the information word is assigned to the code word in the code conversion table so that when the m-bit information word or n-bit code word is taken as one block and the number of blocks is odd, the two's complement of a sum of the information sequences will always differ from that of a sum of the code sequences and when the number of blocks is even, the two's complement of the sum of the information sequences will coincide with that of the sum of code sequences.

Also, in a third example of the coding rule used in the encoder 51 that converts an m-bit information word continuously into an n-bit code word after inserting DC control bits for DC control of a code sequence into an information sequence, only when the coding rule is represented by a finite-state code conversion table and a DC control bit is inserted at the first or second bit of a 2-bit information word, the information word is assigned to the code word in the code conversion table so that when the state $s_0$ of the provisional code sequence $c_0$ resulted from a coding starting with an arbitrary start-point state on the assumption that the DC control bit is 0 becomes the same as the state $s_1$ of the provisional code sequence $c_1$ resulted from a coding starting with the same start-point state as in the provisional code sequence $c_0$ on the assumption that the DC control bit is 1, the two's complement of a sum of the provisional code sequences $c_0$ will always differ from that of a sum of the provisional code sequences $c_1$.

As having been described in the foregoing, the parity-different code word assignment method adopted in the finite-state code conversion table includes the conventional PP code word assignment method in the look-ahead code conversion table and provides a lot of code word assignments outstanding in DC control efficiency other than those provided by the conventional PP code word assignment method. Also in case the parity-different code word assignment in the finite-state code conversion table results in a PP code word assignment in the look-ahead code conversion table, the parity-different code word assignment can be designed more theoretically. So, a code resulted from the parity-difference code word assignment can have the characteristic thereof improved more than a code resulted from the conventional PP code word assignment having been described with reference to FIGS. 7 and 8.

Next, there will be described an improvement of the bit error rate when the maximum number of minimum runs in sequence of the (1, 7) RLL code is decreased to less than the conventional number of six (6) and defocusing or tangential tilt has occurred during data reproduction.

FIG. 29 shows the relation between the maximum number of minimum runs in sequence and the Shannon capacity in the (1, 7) RLL code. The "Shannon capacity" is a theoretical maximum coding rate a limited code can attain. A finite-state code conversion table can be designed of a code whose coding rate less than the Shannon capacity using the aforementioned ACH algorithm.

As will be known from FIG. 29, the maximum number of minimum runs in sequence in the (1, 7) RLL code can be reduced to three when the Shannon capacity is 0.6730 on the assumption that the coding rate is taken as $\frac{2}{3}=0.6667$.

That is, when a 2-bit information word is continuously converted into a 3-bit code word and a coding is done using a coding rule in which the minimum run of a code is limited to one and the maximum run is limited to seven, the maximum number of minimum runs in sequence of the code is limited to three to five.

Next, there will be described a method of designing a finite-state code conversion table for the (1, 7) RLL code in case the maximum number of minimum runs in sequence is five, for example.

Figure 30:
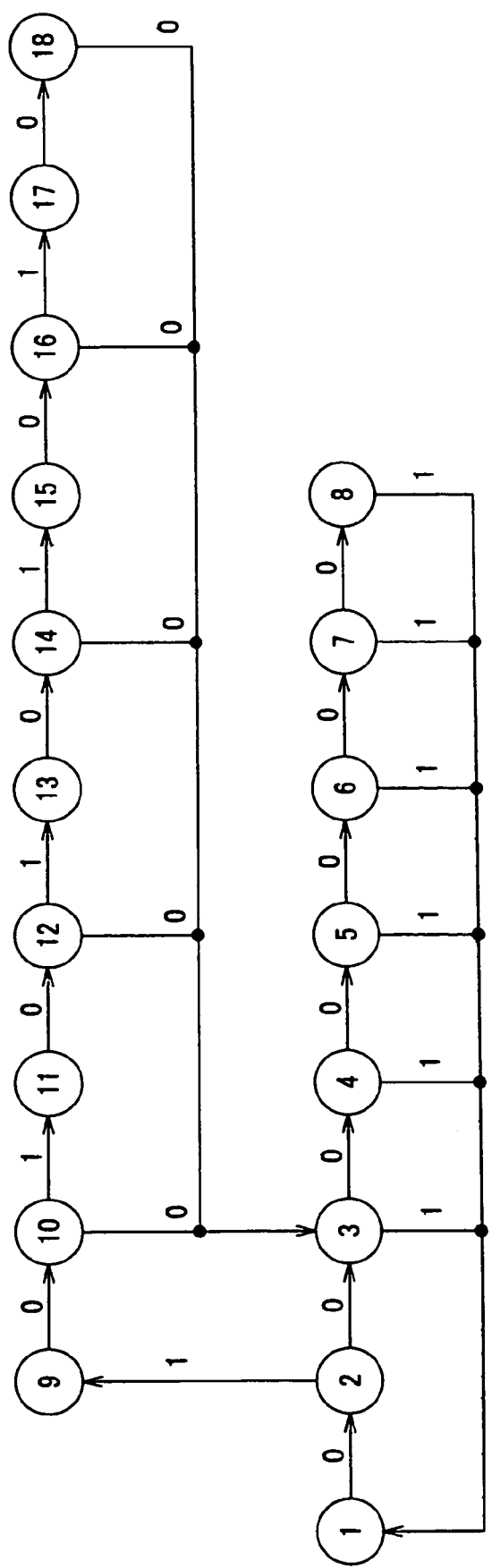
FIG. 30 is a 18-state transition diagram of the (1, 7) RLL code, in which the maximum number of minimum runs in sequence is limited to five.

FIG. 30 is a 18-state transition diagram and premised on the NRZI modulation and that provides both a (1, 7) RLL code limitation and a limitation of the maximum number of minimum runs in sequence to five.

To set the maximum number of minimum runs in sequence to four in FIG. 30, the state transition diagram having the states 17 and 18 deleted therefrom should be used. When it is desired to set the maximum number to three, the state transition diagram having states 15 to 18 deleted therefrom should be used.

First, an approximate character vector "4, 6, 6, 6, 5, 5, 4, 2, 4, 6, 3, 6, 3, 5, 3, 5, 2, 3" is derived on the basis of the finite-state state transition diagram in FIG. 30. Them an 8-state finite state table similar to the 7-state finite state table in FIG. 15 can be designed based on the approximate character vector and ACH algorithm. FIG. 31 shows a finite state table for the (1, 7) RLL code, in which the maximum number of minimum runs in sequence is limited to five.

Then, all the (4!)8=110,075,314,176 code word assignments in the finite state table in FIG. 31 are searched, as in the flow chart in FIG. 17, for code word assignments meeting the condition given by the expression (2), that is, parity-different code word assignments, for an arbitrary information sequence, not depending upon a block length to be checked. As a result, the expression (3) holds when L=7 in case a DC control bit is inserted fixedly at the first or second bit of an information word. At this time, there are found 786,432 parity-different code word assignments. In case the DC control bit is inserted at at least either the first or second bit of the information word, there are found 1,179,648 parity-different code word assignments. The number of code word assignments is $\frac{1}{93312}$ of all the code word assignments in the finite state table in FIG. 31.

However, note here that since the finite state table in FIG. 31 is prepared using the ACH algorithm, which code word assignment is used in the finite state table in FIG. 31, the code resulted from a coding based on the code conversion table after the code word assignment can be decoded by the "sliding block decoding". The code word constraint lengths at the time of decoding include two: one is 5 blocks and the other is 4 blocks. When the code word constraint lengths at the time of decoding is 4 blocks, it includes a code word constraint length of 3 blocks at one bit of a 2-bit information word. In such a case, the code word constraint length remains 4 blocks but the error propagation length will be one bit shorter.

The composition of the 1,179,648 parity-different code word assignments in the finite state table in FIG. 31 will be described with reference to FIG. 32. In FIG. 32, the parity-different code word assignments are sorted in 3 types (types 1 to 3 having been described with reference to FIG. 19). Also in FIG. 32, there are stated a code word assignment of 5 blocks in code word constraint length and code word assignment of 4 blocks in code word constraint length. The parenthesized numbers in FIG. 32 indicate the numbers of ones of 3 blocks in code word constraint length of code word assignments of 4 blocks in code word constraint at one bit of a 2-bit information word.

FIG. 33 shows an example of a finite state-type 8-state code conversion table for the (1, 7) RLL code, in which the parity-different code word assignments are included and the maximum number of minimum runs in sequence is limited to five. In the code word assignment in the code conversion table in FIG. 33, the code word constraint length at the time of decoding is 4 blocks, the code word constraint length at one of the bits of a 2-bit information word is 3 blocks, and the parity-different code word assignment will be done whether the DC control bit is inserted t the first or second bit of the 2-bit information word. This code word assignment is one of 256 code word assignments of the type 3 shown in FIG. 32.

The code resulted from a coding based on the code conversion table in FIG. 33 is considerably improved as compared with the codes resulted from a coding based on the conventional code conversion tables in FIGS. 7, 8 and 9. Namely, it has the maximum number of minimum runs in sequence thereof decreased from six to five, the number of states at the time of coding decreased from 1691 to 8, the code word constraint length at the time of decoding decreased from 6 blocks to 4 blocks, and the error propagation length at the time of decoding decreased from 15 bits to 7 bits.

The code, in which the maximum number of minimum runs in sequence is limited to five by the above coding method of converting a 2-bit information word continuously into a 3-bit code word whose the minimum run is limited to one and maximum run is limited to seven, is superb in characteristic to a code in which the maximum number of minimum runs in sequence is six. In step S6 in FIG. 13, the encoder 51 having been described with reference to FIGS. 11 to 13 makes a coding using a code in which the maximum number of minimum runs in sequence is limited to five, whereby the number of states at the time of coding, the code word constraint length at the time of decoding, and the error propagation length at the time of decoding, can be reduced to values, respectively, smaller than ever.

Also, in case the coding rule is represented by the finite-state code conversion table, the number of states can be limited to eight.

Also the finite-state code conversion table in FIG. 33 can be converted into a look-ahead one by re-assigning a code word advanced 1 block to an information word. The resultant look-ahead code conversion table has a basic code conversion table that is the quite same as that shown in FIG. 25. Namely, the look-ahead code conversion table thus obtained includes the basic code conversion table in FIG. 25 and irregular code conversion table in FIG. 34 added to the latter.

That is to say, the irregular code conversion table in FIG. 34 is added to the look-ahead code conversion table in FIG. 25 in order to limit the maximum number of minimum runs in sequence to five. According to the irregular code conversion table in FIG. 34, an input information word "10.11" is converted into a code word "000.001" without application of the code conversion table in FIG. 25 when a preceding code word is "010".

In the irregular code conversion table in FIG. 34, the code word assignment is done for an information sequence to coincide in parity with a code sequence when the number of blocks is even, as in the code conversion table in FIG. 25. By making a coding according to a coding rule resulted from addition of the look-ahead irregular code conversion table in FIG. 34 to the look-ahead basic code conversion table in FIG. 25, the maximum number of minimum runs in sequence can be limited to five while maintaining the parity-different code word assignment. It should be noted however that this coding method is equivalent to a coding based on the finite-state code conversion table in FIG. 33.

FIG. 35 shows the results of calculation of the number of code states at the time of coding, code word constraint length at the time of decoding and error propagation length at the time of decoding in the 7-state code conversion tables in FIGS. 20 to 22 and 8-state code conversion table in FIG. 33.

By making a comparison between FIGS. 35 and 10, it will be understood that the coding method based on the 7-state code conversion tables in FIGS. 20 to 22 and the 8-state code conversion table in FIG. 33 can make a coding with a much more improved number of states at the time of coding, code word constraint length at the time of decoding and error propagation length at the time of decoding than those attained by the coding method based on the conventional code conversion tables shown in FIGS. 7, 8 and 9.

Note that any method may be used for decoding the code resulted from the aforementioned coding method according to the present invention. Since the code word constraint length at the time of decoding is determined as in FIG. 35, the code resulted from the aforementioned coding may be decoded by a common sliding-block decoding, for example.

Also, since the number of states is relatively small in the coding method according to the present invention, the code may be decoded by a soft decision using the % Trellis diagram based on the finite-state code conversion table, for example.

For example, in case a code resulted from a coding based on the code conversion table in FIG. 21 or 33 is decoded by the sliding-block decoding, representation of an input code word sequence of 4 blocks (12 bits) by "b0, b1, b2, b3, b4, b5, b6, b7, b8, b9, b10, b11" starting with the past side permits a very simple circuit to decode a 2-bit information word "a0, a1" using the Boolean logic formula given by the following expressions (4) and (5).

$$a_0 = b_2(b_6 + \overline{b_5}b_7) + \\ b_4(b_6 + b_7 + \overline{x}\overline{b_8}\overline{b_9}\overline{b_{10}}) + b_3b_5 + \overline{b_2}\overline{b_3}\overline{b_4}(\overline{b_1} + \overline{x}\overline{b_5}\overline{b_6}\overline{b_7}) \quad (4)$$

$$a_1 = b_4 + \overline{b_2}\overline{b_3}(b_0 \oplus b_5) + \overline{b_5}\overline{b_6}\overline{b_7}(\overline{b_1} + b_3 + x) \quad (5)$$

However, when x=0, both codes represented as in FIGS. 33 and 21 can be decoded, and when x=1, a code represented as in FIG. 21 can be decoded. Also, the bit "b11" is not used in the sliding-block decoding. The DC control bit inserted during coding is normally abandoned at the time of decoding.

The aforementioned series of operations can be effected by a software. The software is installed from a recording medium into a computer with a dedicated hardware having a program forming the software installed therein or a general-purpose personal computer in which various programs can be installed and which can perform various functions according to the corresponding programs.

The recording medium having recorded therein a program under which the aforementioned series of operations is effected is a package medium including a magnetic disk 141 (including a flexible disk), optical disk 142 (including CD-ROM(=compact disk—read-only memory), DVD (digital versatile disk), magneto-optical disk 143 (MD (=Mini-Disk; registered trademark)), semiconductor memory 144 or the like as shown in FIG. 16.

Note that in this Specification, the steps of stating a program that is to be recorded to the recording medium include operations effected time-serially in their stated order as well as those effected not always time-serially but in parallel or individually.

In the foregoing, the present invention has been described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

As having been described in the foregoing, the present invention permits a code conversion. More particularly, in case a coding rule is represented by a finite-state code conversion table, the code conversion can be done under a coding rule by which a code word is assigned to an information word so that when a first code state of a first provisional code sequence encoded starting with a predetermined start-point state becomes identical to a second code state of a second provisional code sequence encoded starting with the predetermined standpoint state, two's complement of a sum of coding bits included in the first provisional code sequence will always differ from that of a sum of coding bits included in the second provisional code sequence.

Also, according to another aspect of the present invention, the coding can be done under a coding rule in which the minimum run is limited to one, maximum run is limited to seven and the maximum number of minimum runs in sequence is three to five.

What is claimed is:

1. A coding program for converting an m-bit information word continuously into an n-bit code word, the program comprising the steps of:

generating a first information sequence by inserting a first DC control bit into an input information sequence at predetermined intervals and generating a second information sequence by inserting a second DC control bit different from the first DC control bit into the input information sequence at the predetermined intervals;

generating a first provisional code sequence by making a code conversion of the first information sequence generated in the information sequence generating step at a conversion ratio of an information word length m to an code word length n;

generating a second provisional code sequence by making a code conversion of the second information sequence generated in the information sequence generating step at the conversion ratio of the information word length m to the code word length n; and delaying the first provisional code sequence and producing a delayed first provisional code seguence;

delaying the second provisional code sequence and producing a delayed second provisional code sequence; and selecting either the delayed first provisional code sequence generated in the first code generating step or the delayed second provisional code sequence generated in the second code generating step, wherein the first and second code converting steps uses a coding rule by which, in case the coding rule is represented by a finite-state code conversion table, code words are assigned to information words so that a two's complement of a sum of coding bits included in the first provisional code sequence is always different from a two's complement of a sum of coding bits included in the second provisional code sequence when a first code state of the first provisional code sequence encoded starting with a predetermined original state, is identical to a second code state of the second provisional code sequence encoded starting with the predetermined original state.

* * * * *